US010106736B2

(12) United States Patent
Akagi et al.

(10) Patent No.: US 10,106,736 B2
(45) Date of Patent: Oct. 23, 2018

(54) ETCHING AGENT FOR SEMICONDUCTOR SUBSTRATE

(71) Applicant: SETTSU OIL MILL., INC., Osaka-shi, Osaka (JP)

(72) Inventors: Seimei Akagi, Sakai (JP); Yoshiteru Kamada, Osaka (JP); Noboru Ohyagi, Osaka (JP); Toshinori Saida, Sakai (JP); Kazuhiro Moriwaki, Osaka (JP); Yuzo Yamamoto, Izumisano (JP)

(73) Assignee: SETTSU OIL MILL., INC., Osaka-Shi (JP)

( * ) Notice: Subject to any disclaimer, the term of this patent is extended or adjusted under 35 U.S.C. 154(b) by 0 days.

(21) Appl. No.: 15/520,468

(22) PCT Filed: Oct. 20, 2015

(86) PCT No.: PCT/JP2015/079598
§ 371 (c)(1),
(2) Date: Apr. 20, 2017

(87) PCT Pub. No.: WO2016/063881
PCT Pub. Date: Apr. 28, 2016

(65) Prior Publication Data
US 2017/0306229 A1    Oct. 26, 2017

(30) Foreign Application Priority Data
Oct. 21, 2014  (JP) ................ 2014-214876

(51) Int. Cl.
*H01L 21/00* (2006.01)
*C09K 13/02* (2006.01)
(Continued)

(52) U.S. Cl.
CPC .......... *C09K 13/02* (2013.01); *H01L 31/028* (2013.01); *H01L 31/02363* (2013.01);
(Continued)

(58) Field of Classification Search
CPC ............ H01L 31/02363; H01L 31/028; H01L 31/068; H01L 31/1804
See application file for complete search history.

(56) References Cited

U.S. PATENT DOCUMENTS

| 5,431,777 A | 7/1995 | Austin et al. |
| 2009/0266414 A1 | 10/2009 | Tsuchiya et al. |

(Continued)

FOREIGN PATENT DOCUMENTS

| JP | 6-188236 A | 7/1994 |
| JP | 2005-19606 A | 1/2005 |

(Continued)

OTHER PUBLICATIONS

International Search Report (Form PCT/ISA/210), dated Dec. 22, 2015, for International Application No. PCT/JP2015/079598.

*Primary Examiner* — Richard Booth
(74) *Attorney, Agent, or Firm* — Birch, Stewart, Kolasch & Birch, LLP

(57) ABSTRACT

The present invention relates to an alkaline etching agent for treating a surface of a semiconductor substrate for solar cells, containing at least one hydroxystyrene polymer represented by the general formula (1) and an alkaline agent. According to the present invention, some effects are exhibited that the texture formation is made possible to a semiconductor substrate for solar cells at relatively lower temperatures with a shorter amount of time, thereby having excellent productivity.

14 Claims, 2 Drawing Sheets

(51) Int. Cl.
    *H01L 31/0236*    (2006.01)
    *H01L 31/18*    (2006.01)
    *H01L 31/028*    (2006.01)
    *H01L 31/0368*    (2006.01)
    *H01L 31/068*    (2012.01)

(52) U.S. Cl.
    CPC ...... *H01L 31/03682* (2013.01); *H01L 31/068* (2013.01); *H01L 31/1804* (2013.01)

(56) References Cited

U.S. PATENT DOCUMENTS

| | | |
|---|---|---|
| 2009/0280597 A1 | 11/2009 | Wijekoon et al. |
| 2012/0295447 A1 | 11/2012 | Tamboli et al. |

FOREIGN PATENT DOCUMENTS

| | | |
|---|---|---|
| JP | 2011-515872 A | 5/2011 |
| JP | 2012-114449 A | 6/2012 |
| WO | WO 2007/129555 A1 | 11/2007 |
| WO | WO 2012/023613 A | 2/2012 |
| WO | WO 2012/144461 A1 | 10/2012 |
| WO | WO 2014/010471 A1 | 1/2014 |
| WO | WO 2015/041214 A1 | 3/2015 |

[FIG. 1]
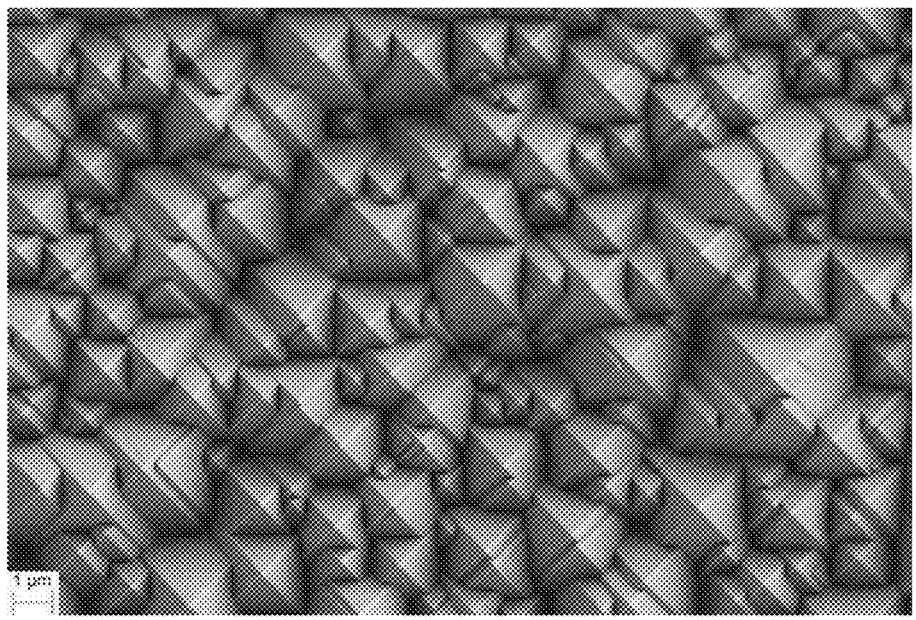
[FIG. 2]
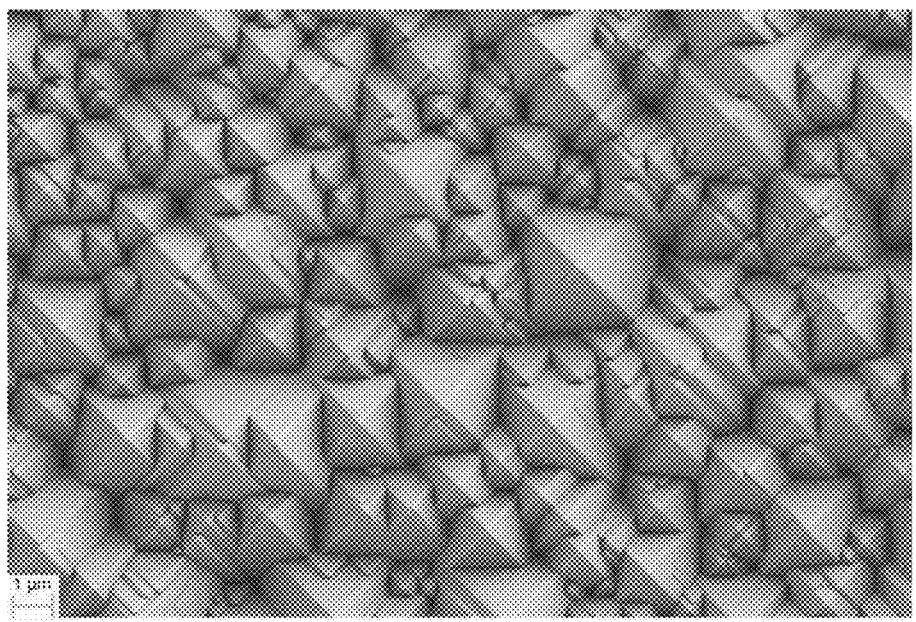

[FIG. 3]
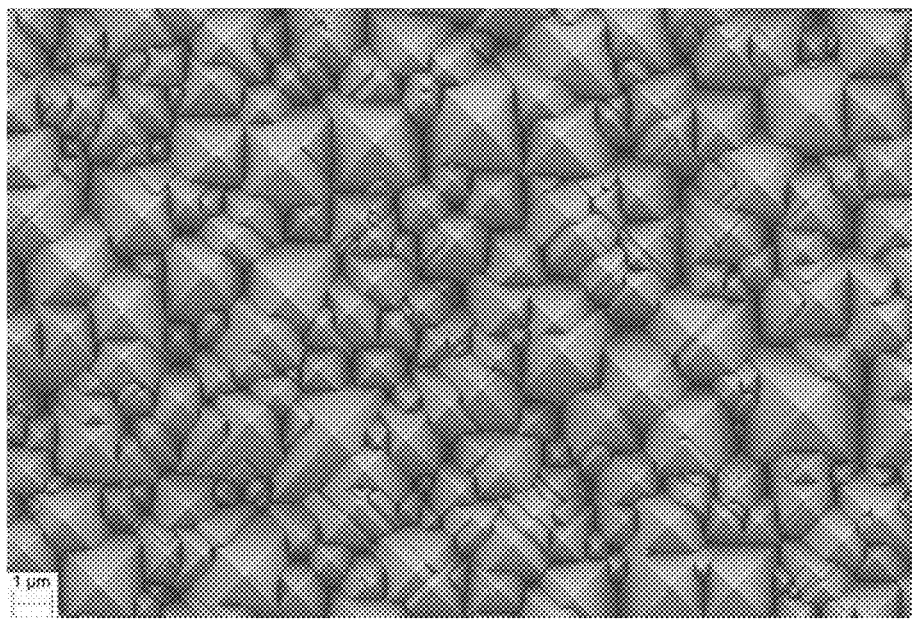
[FIG. 4]
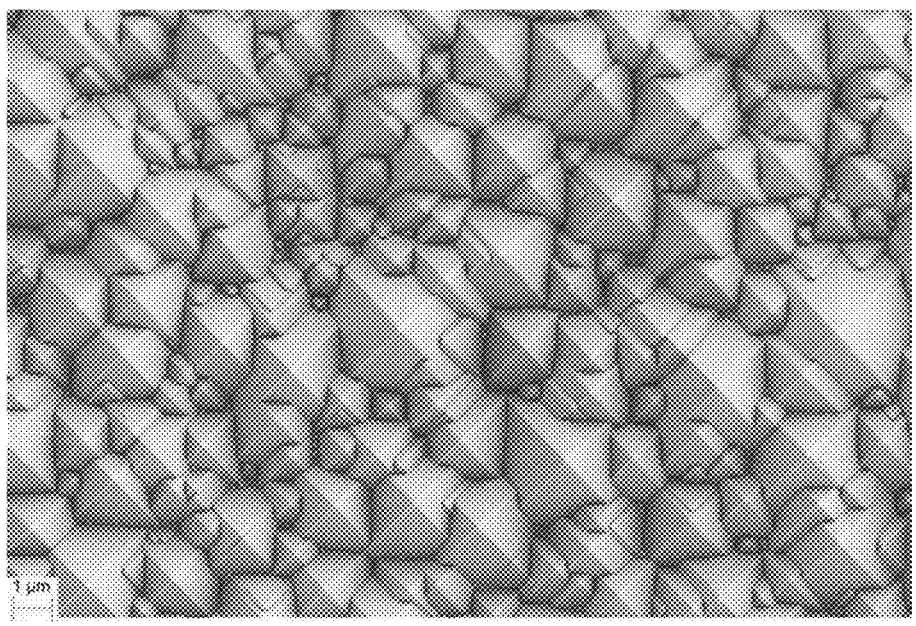

ously and stably obtain pyramidal sizes within a certain range. The uniformity of the texture sizes not only influences the power generation efficiency but also improves coating for passivation or protective film for preventing the lowering of the power generation efficiency.

ETCHING AGENT FOR SEMICONDUCTOR SUBSTRATE

TECHNICAL FIELD

The present invention relates to an etching agent for semiconductor substrates, especially an etching agent for semiconductor substrates for solar cells. Further, the present invention relates to an etching ability restoring agent, a method for producing a semiconductor substrate for solar cells, and a semiconductor substrate for solar cells.

BACKGROUND OF THE INVENTION

In order to increase power generation efficiencies of solar cells, conventionally, a method in which ruggedness is formed on the surface of a semiconductor substrate for solar cells, and incident light from the substrate surface is efficiently incorporated into an internal of the substrate has been employed. As a method of uniformly forming fine ruggedness on a substrate surface, a method including subjecting a (100) plane of a monocrystalline silicon substrate with an anisotropic etching treatment using a mixed aqueous solution of sodium hydroxide and isopropyl alcohol, to form ruggedness of pyramidal forms (quadrangular pyramidal form) constituted by (111) plane has been known. However, since isopropyl alcohol (IPA) is used, this method has some disadvantages in the aspect of quality due to fluctuations of components due to evaporation of IPA or waste liquid treatment, operating environment, and safety. In addition, the treatments at relative high temperatures for a long amount of time are needed, so that improvements are desired in the aspect of productivity.

In the techniques of improving the above, Patent Publication 1 describes a method in which etching rates when the substrate surface is etched are stabilized by including a specified aliphatic carboxylic acid and silicon in an alkaline an etching agent, thereby uniformly forming pyramid-shaped ruggedness of desired sizes on the substrate surface.

On the other hand, in a case of a polycrystalline silicon substrate, since plural crystal orientation planes appear on the surface, sufficient lowering of the reflectivities is not seen by the above alkali type etching treatment. Therefore, generally, etching is carried out using a mixed acid of hydrofluoric acid and nitric acid, to form ruggedness on the surface.

PRIOR ART REFERENCES

Patent Publications

Patent Publication 1: WO 2007/129555

SUMMARY OF THE INVENTION

Problems to be Solved by the Invention

However, as to the monocrystalline silicon substrate, in the method of Patent Publication 1, it was difficult to stably form pyramidal ruggedness having an average of 5 μm or less on the surface, to stably obtain an optical reflectivity of 10% or less. In addition, in the latter half upon continuous repetitious use, fluctuations of the pyramidal sizes are greater because of the influences of by-products due to used-up components and etching reactions, thereby making it disadvantageous in controlling ability. In the working sites, tremendous labor and time were needed in order to continuously and stably obtain pyramidal sizes within a certain range. The uniformity of the texture sizes not only influences the power generation efficiency but also improves coating for passivation or protective film for preventing the lowering of the power generation efficiency.

In order to prevent a semiconductor substrate for solar cells from forming non-uniform ruggedness on the substrate surface, it is necessary to frequently confirm whether or not ruggedness of a desired size is formed uniformly on a substrate surface, and exchange an etching agent when non-uniform ruggedness is started to form on the substrate surface.

In addition, as to the polycrystalline silicon substrate, in the above etching method using a mixed acid, hydrofluoric acid having high corrosion and toxicity is used, a special care in handling is needed. Also, the method is more costly in the wastewater treatment as compared to the alkali type etching agent. The utilization of hydrofluoric acid is disadvantageous in aspects of working environment, safety, and waste liquid treatment. Further, at present, a crystal slice method according to a loose abrasive method has been well used, but the transition to a crystal slice method according to a bonded-abrasive method has been earnestly desired, from the viewpoint of cost reduction and improvement in productivity. However, a silicon substrate obtained by a bonded abrasive method does not well progress in the formation of ruggedness by the etching method with a mixed acid, perhaps due to the machining damage layer remaining on the surface, so that the improvements in the etching agent and the development of a new etching procedure have been earnestly desired.

The present invention is accomplished in order to solve the above problems, and an object thereof is to provide an etching agent having excellent controlling ability of a pyramidal size at relatively lower temperatures with an even shorter amount of time, and having excellent an initial rise, without causing environmental problems and quality fluctuations as mentioned above. Further, even when semiconductor substrates for solar cells in a large number are subjected to a continuous etching treatment, it is to provide a technique of accomplishing low optical reflectivity of a semiconductor substrate for solar cells by uniformly forming ruggedness of desired sizes on the substrate surface. In addition, as to a polycrystalline silicon substrate, in addition to these objectives, it is to provide an etching agent which can also be effectively used in a silicon substrate obtained by not only a loose abrasive method but also a bonded-abrasive method. Here, in the monocrystalline silicon substrate, the disadvantages caused by a difference in the slice methods do not exist as in the polycrystalline silicon method, and the etching agent can be used in either one of the slice methods.

Means to Solve the Problems

As a result of intensive studies in order to solve the above problems, the present inventors have found that surface quality and uniformity of the texture structure can be greatly improved in any of monocrystalline silicon substrates and polycrystalline silicon substrates by the use of a hydroxystyrene polymer satisfying certain conditions, so that the productivity is excellent and continuous usage can be greatly improved. The present invention has been perfected thereby.

In addition, they have found that production stability and texture quality can be even more improved by the use of the above component together with at least one member selected from specified chelating agents and specified organic compounds. More specifically, the present invention provides the following.

Specifically, the gist of the present invention relates to:

[1] an alkaline etching agent for treating a surface of a semiconductor substrate for solar cells, containing
at least one hydroxystyrene polymer represented by the following general formula (1):

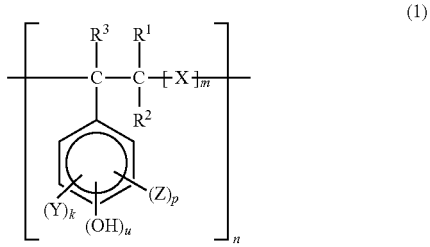

wherein each of m and n is m≥0 and n≥3, and is any number in which a weight-average molecular weight of the polymer represented by the general formula (1) satisfies a range of from 1,000 to 50,000; each of k, p, and u is 0≤k≤2, 0≤p≤2, and 0≤2, wherein k, p, and u is an average in the polymer; each of $R^1$ to $R^3$ is H or an alkyl group having from 1 to 5 carbon atoms; X is a constituting unit of a polymerizable vinyl monomer; each of Y and Z, which is identical or different, is a substituent selected from the group consisting of

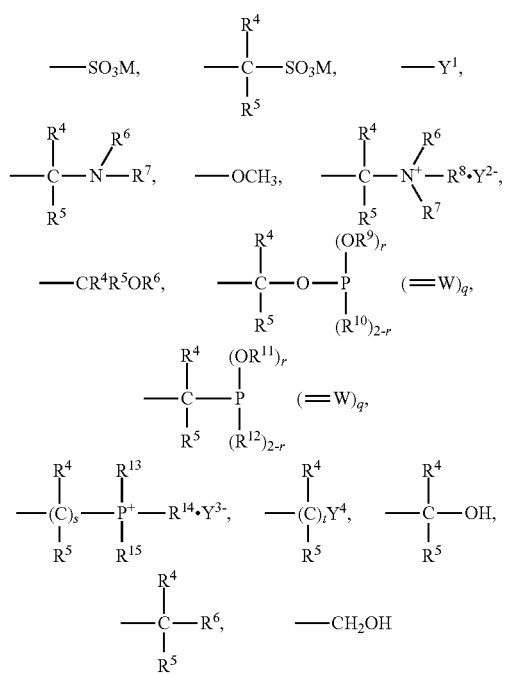

or an alkyl group having from 1 to 18 carbon atoms or an aryl group having from 6 to 18 carbon atoms, wherein M is H, an alkali metal, an alkaline earth metal, or an organic cation; each of $Y^1$ and $Y^4$ is a halogen; each of $Y^{2-}$ and $Y^{3-}$ is a counterion; W is S or O; each of $R^4$ to $R^8$, which is identical or different, is a linear or branched alkyl group, an alkyl derivative group, an aromatic group, or H, wherein $R^6$ and $R^7$ may further form a ring via an N group; each of $R^9$ to $R^{15}$, which is identical or different, is a linear or branched alkyl group, an alkyl derivative group, an aromatic group, or H; each of q, s, and t is 0 or 1; and r is 0, 1, or 2, and an alkaline agent;

[2] an etching ability restoring agent for adding to an etching agent as defined in the above [1] after treatment of a semiconductor substrate for solar cells with the etching agent, and restoring etching ability of the etching agent, wherein the etching ability restoring agent contains an alkaline agent, and at least one member of a hydroxystyrene polymer represented by the above general formula (1);

[3] a method for producing a semiconductor substrate for solar cells, including an etching step of etching a substrate surface of a semiconductor substrate for solar cells with an etching agent as defined in the above [1] to form ruggedness on the above substrate surface; and

[4] a semiconductor substrate for solar cells, wherein a surface thereof is subjected to an etching treatment with an etching agent as defined in the above [1].

Effects of the Invention

According to the present invention, some effects are exhibited that the texture formation is made possible to a semiconductor substrate for solar cells at relatively lower temperatures with a shorter amount of time, thereby having excellent productivity. The present invention is effective in both the monocrystalline silicon and the polycrystalline silicon. In addition, pyramidal ruggedness of an average of 5 μm or less is stably formed, so that surface shapes showing optical reflectivity of preferably 10% or less in a monocrystalline silicon substrate, and preferably 25% or less in a polycrystalline silicon substrate (bonded-abrasive slice product) can be stably offered to the semiconductor surface for solar cells, which could not be obtained in the prior art. Further, since the surface defects are reduced, a texture having excellent surface quality can be formed on a semiconductor surface for solar cells.

BRIEF DESCRIPTION OF THE DRAWINGS

FIG. 1 is a scanning electron micrograph showing a surface structure of a semiconductor substrate after the etching treatment in Example 17 of the specification of the present application.

FIG. 2 is a scanning electron micrograph showing a surface structure of a semiconductor substrate after the etching treatment in a first batch in Example 44 of the specification of the present application.

FIG. 3 is a scanning electron micrograph showing a surface structure of a semiconductor substrate after the etching treatment in a tenth batch in Example 44 of the specification of the present application.

FIG. 4 is a scanning electron micrograph showing a surface structure of a semiconductor substrate after the etching treatment in a 35th batch in Example 44 of the specification of the present application.

MODES FOR CARRYING OUT THE INVENTION

The embodiments of the present invention will be described hereinbelow. Here, the present invention is not limited to the following embodiments.

The etching agent of the present invention is an alkali aqueous solution for treating a surface of a semiconductor surface for solar cells, which has a feature in that the etching agent contains at least one kind of an alkali component, and a hydroxystyrene polymer satisfying certain conditions. It is preferable that at least one member selected from the group consisting of specified ligninsulfonic acids and ligninsulfonates is contained in the etching agent of the present invention. One of the preferred embodiments of the etching agent of the present invention includes a composition containing at least one member of an alkali component, and a polyhydroxystyrene, and a ligninsulfonic acid and/or a ligninsulfonate. Here, in the general formula (1), a compound in which each of m, k, and p is 0, u is 1, and each of $R^1$ to $R^3$ is H is a polyhydroxystyrene. Another preferred embodiment of the etching agent of the present invention includes a composition containing at least one kind of an alkali component and a hydroxystyrene polymer other than the polyhydroxystyrene (which may be hereinafter referred to as "derivatives of polyhydroxystyrene" in some cases), and in this composition, a composition further containing a ligninsulfonic acid and/or a ligninsulfonate is more preferred.

It is more preferable that the etching agent of the present invention further contains a specified chelating agent, silicic acid and/or a silicate.

The etching agent of the present invention is alkaline. Specifically, a pH at 25° C. is preferably within the range of from 12 to 14, and preferably within the range of from 13 to 14. By properly changing an amount or concentration of an alkaline agent described later, the pH of the etching agent can be set to a desired range.

In the present invention, the polymer contained in the etching agent includes, for example, a hydroxystyrene polymer represented by the following general formula (1):

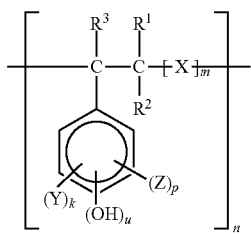

wherein each of m and n is m≥0 and n≥3, and is any number in which a weight-average molecular weight of the polymer represented by the general formula (1) satisfies a range of from 1,000 to 50,000; each of k, p, and u is 0≤k≤2, 0≤p≤2, and 0<u≤2, wherein k, p, and u is an average in the polymer; each of $R^1$ to $R^3$ is H or an alkyl group having from 1 to 5 carbon atoms; X is a constituting unit of a polymerizable vinyl monomer; each of Y and Z, which is identical or different, is a substituent selected from the group consisting of

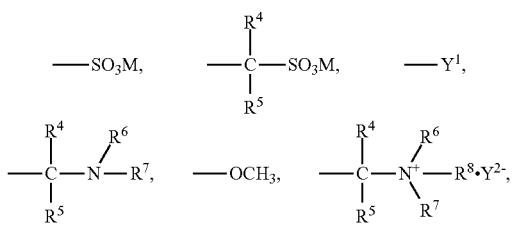

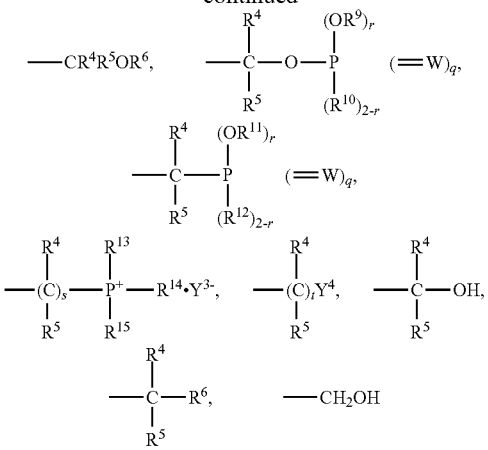

or an alkyl group having from 1 to 18 carbon atoms or an aryl group having from 6 to 18 carbon atoms, wherein M is H, an alkali metal, an alkaline earth metal, or an organic cation (for example, an amine, etc.); each of $Y^1$ and $Y^4$ is a halogen; each of $Y^{2-}$ and $Y^{3-}$ is a counterion (for example, a halogen ion, an organic acid anion, an inorganic acid anion (e.g., nitric acid ion), etc.); W is S or O; each of $R^4$ to $R^8$, which is identical or different, is a linear or branched alkyl group, an alkyl derivative group, an aromatic group, or H, wherein $R^6$ and $R^7$ may further form a ring via an N group; each of $R^9$ to $R^{15}$, which is identical or different, is a linear or branched alkyl group, an alkyl derivative group, an aromatic group, or H; each of q, s, and t is 0 or 1; and r is 0, 1, or 2. The polymer and derivatives thereof may be used alone or in combination of two or more kinds.

In the above general formula (1), each of m, n, k, p, and u is any number (real number) within a certain range. If a monomer constituting the polymer is considered, each of k and p is as a matter of course an integer, and if considered in the unit of blocks of the constituting units, m is an integer, and if considered in the unit of molecules, n is an integer. However, the polymer is a mixture in its entirety, and it is more appropriate to understand the characteristics of the polymer as characteristics of the mixture rather than addressing as individual constituting units. Therefore, in the present invention, each of m, n, k, p, and u is shown as an average in the polymer.

The hydroxystyrene polymer embraces a polyhydroxystyrene and derivatives of the polyhydroxystyrene. The polyhydroxystyrene is a compound in the general formula (1) where each of m, k, and p is 0, u is 1, and each of $R^1$ to $R^3$ is H. The weight-average molecular weight of the polyhydroxystyrene is from 1,000 to 50,000, and n is any number of 3 or more. The preferred weight-average molecular weight of the polyhydroxystyrene is from 1,000 to 20,000, and more preferably from 1,000 to 10,000. The polyhydroxystyrene having a weight-average molecular weight of 1,000 or more is preferred, from the viewpoint of availability of the polyhydroxystyrene, and the polyhydroxystyrene having a weight-average molecular weight of 50,000 or less is preferred, from the viewpoint of uniformity of pyramidal sizes.

The hydroxystyrene polymer represented by the above general formula (1) can be a homopolymer or copolymer of hydroxystyrene monomers themselves, such as hydroxystyrene, hydroxy-α-methylstyrene, or hydroxy-α-ethylstyrene, which is a compound that has or does not have a substituent as represented by Y or Z in the general formula (1), or a copolymer of these hydroxystyrene monomers with other polymerizable vinyl monomers (for example, a monomer providing a constituting unit X). The hydroxystyrene monomers as the polymerization units may be ortho-form, meta-form, para-form, or mixtures thereof, and para-form or meta-form is preferred.

In addition, other vinyl monomers in a case where a hydroxystyrene polymer represented by the general formula (1) is a copolymer, i.e. a monomer providing a constituting unit X, includes known compounds such as ionic monomers such as anionic monomers and cationic monomers, nonionic monomers, and methacrylate, vinyl esters, vinyl ethers, maleates, fumarates, and α-olefins.

Specific examples of these compounds representatively include unsaturated carboxylic acid monomers such as acrylic acid, methacrylic acid, maleic acid, or anhydrides thereof, and monoalkyl esters thereof and carboxyethyl vinyl ether; unsaturated sulfonic acid monomers such as styrenesulfonic acid and allylsulfonic acid; unsaturated phosphoric acid monomers such as vinylphosphonic acid and vinyl phosphates; α,β-unsaturated carboxylic acid amides such as acrylamide and methacrylamide; α,β-unsaturated carboxylates such as methyl acrylate, methyl methacrylate, ethyl acrylate, and diesters of maleic acid and fumaric acid; substituted amides of unsaturated carboxylic acids such as methylol acrylamide; α,β-unsaturated carboxylic acid nitrile such as acrylonitrile and methacrylonitrile; vinyl acetate, vinyl chloride, vinyl chloroacetate, and divinyl compounds such as divinylbenzene; vinylidene compounds, aromatic vinyl compounds represented by styrene, heterocyclic vinyl compounds represented by vinylpyridine and vinylpyrrolidone; vinyl ketone compounds; monoolefin compounds such as propylene; conjugated diolefin compounds such as butadiene; allyl compounds such as allyl alcohol; and glycidyl methacrylate, and the like. One or more members of the above compounds can be suitably used as a vinyl monomer for providing a constituting monomer X.

These monomers can be, but not particularly limited to, used in any one of them, and, for example, monomers showing the following constituting unit upon forming a polymer are preferably used.

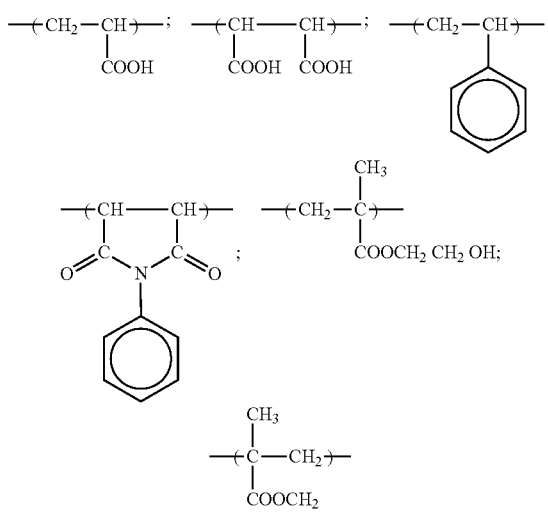

The hydroxystyrene polymer in the present invention may be a homopolymer of the hydroxystyrene monomers themselves or a copolymer as mentioned above. In a case where the hydroxystyrene polymer is a copolymer with other polymerizable vinyl monomers, in other words a vinyl monomer providing a constituting unit X, the proportion of vinyl monomer/hydroxystyrene monomer is preferably, for example, in a molar ratio of from 10/1 to 20/1.

When the proportion of the vinyl monomer providing a constituting unit X exceeds 20 times the amount (molar ratio) of the hydroxystyrene monomer, it is not preferred because the effects of the hydroxystyrene monomers cannot be exhibited, and when the proportion of the vinyl monomer is less than 10 times the amount thereof, the copolymerizing effects are not exhibited, so that it is not needed to intentionally copolymerize with the vinyl monomer. Therefore, in the present invention, the number of the constituting unit X of the vinyl monomer as described above is m≥0.

In addition, the substituents of the hydroxystyrene monomer include the following (i) to (vi).

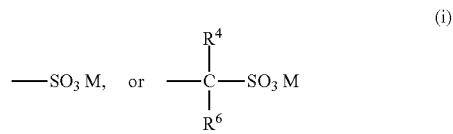

(i)

wherein M is H, an alkali metal, an alkaline earth metal, or an organic cation (for example, an amine), and, for example, Li, Na, K, Mg, Ca, Sr, Ba, and the like are preferred. The introduction of a sulfonic group can be accomplished by an ordinary sulfonation method using a fuming sulfuric acid, anhydrous sulfuric acid or the like as a sulfonation agent.

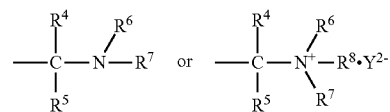

wherein each of $R^4$ to $R^8$, which is identical or different, is a linear or branched alkyl group, an alkyl derivative group, an aromatic group, or H, wherein $R^6$ and $R^7$ may further form a ring via an N group. Also, $Y^{2-}$ is a counterion, for example, a halogen ion, an organic acid anion, an inorganic acid anion, and the like. Here, the linear or branched alkyl group includes those having from 1 to 36 carbon atoms (for example, methyl group, and the like), and the alkyl derivative group includes a hydroxyalkyl group, an aminoalkyl group, a phosphoalkyl group, a mercaptoalkyl group, and the like, and the aromatic group includes a benzyl group substituted with a linear or branched alkyl group having from 1 to 16 carbon atoms, and the like. Preferably, the substituent includes a linear or branched alkyl group, a hydroxyalkyl group, or an aromatic group substituted with a linear or branched alkyl group having from 1 to 5 carbon atoms. As to the introduction of the above tertiary amino group, for example, —CH$_2$—N($R^6$)($R^7$) is readily obtained by a Mannich reaction using a dialkylamine and formaldehyde. As to the introduction of the quaternary ammonium base, for example,

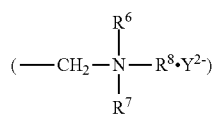

is readily obtained by Menschutkin reaction by treating the above tertiary amino compound with an alkyl halide.

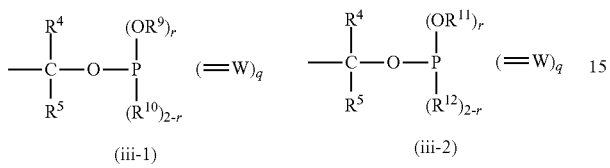

wherein each of $R^4$ and $R^5$ are as defined above; each of $R^9$ to $R^{12}$, which is identical or different, is a linear or branched alkyl group, an alkyl derivative group, an aromatic group, or H. Also, W is S or O, q is 0 or 1, and r is 0, 1, or 2. Here, the linear or branched alkyl group includes those having from 1 to 36 carbon atoms, and the alkyl derivative includes a hydroxyalkyl group, an aminoalkyl group, a mercaptoalkyl group, a phosphoalkyl group, and the like, and the aromatic group includes a phenyl group substituted with a linear or branched alkyl group having from 1 to 16 carbon atoms, and the like. Preferably, the substituent includes a linear or branched alkyl group having 18 carbon atoms, a hydroxyalkyl group, or an aromatic group substituted with a linear or branched alkyl group having from 1 to 5 carbon atoms.

The substituent represented by the formula (iii-1) is, as disclosed, for example, in Japanese Patent Laid-Open No. Sho-53-71190, obtained by subjecting a hydroxystyrene polymer to methylol formation, and thereafter treating with phosphoric acid or a phosphate group introducing compound. The hydroxystyrene polymer represented by the formula (iii-2) is, as disclosed, for example, in Japanese Patent Laid-Open No. Sho-53-47489, obtained by first halogenating or halomethylating a hydroxystyrene polymer, and reacting the product with a trivalent phosphorus-containing compound (Arbuzov reaction), and thereafter subjecting the resulting product to thermal rearrangement.

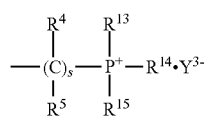

wherein each of $R^4$ and $R^5$ are as defined above; each of $R^{13}$, $R^{14}$, and $R^{15}$, which is identical or different, is a linear or branched alkyl group, an alkyl derivative group, an aromatic group, or H. Also, S is 0 or 1. Also, $Y^{3-}$ is a counterion, for example, a halogen ion, an organic acid anion, an inorganic acid anion, and the like. This hydroxystyrene polymer containing a phosphonium group is, as shown, for example, in Japanese Examined Patent Publication No. Sho-61-34444, readily obtained by reacting a hydrogen halide and formaldehyde, halogenomethylating the product (e.g., formation of —$CH_2Cl$), and thereafter treating with a trivalent phosphite ester.

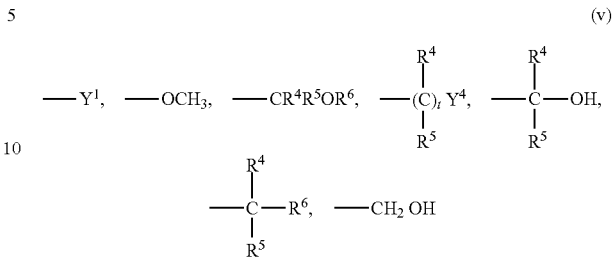

wherein $Y^1$ or $Y^4$ is a halogen; each of $R^4$, $R^5$, and $R^6$ is as defined above; t is 0 or 1.

(vi): Others include an alkyl group having from 1 to 18 carbon atoms, or an aryl group having from 6 to 18 carbon atoms.

In the general formula (1), the numbers of Y and Z, which are substituents for the above hydroxystyrene polymer, in an average of each of the polymers is $0 \le k \le 2$, and $0 \le p \le 2$, and the number of OHs u is $0 < u \le 2$.

The hydroxystyrene polymer which can be used as a constituent for the etching agent according to the present invention has a weight-average molecular weight within a range of from 1,000 to 50,000, preferably within a range of from 1,000 to 20,000, and more preferably within a range of from 1,000 to 10,000. The hydroxystyrene polymer having a weight-average molecular weight of 1,000 or more is preferred, from the viewpoint of availability of the polymer, and the hydroxystyrene polymer having a weight-average molecular weight of 50,000 or less is preferred, from the viewpoint of uniformity in pyramidal sizes.

The weight-average molecular weight of the hydroxystyrene polymer as used herein is value obtained by a method in the same manner as the molecular weight and the molecular weight distribution using GPC of ligninsulfonic acid and a salt thereof described later (with a different solvent).

In the hydroxystyrene polymer, it is preferable that a polar group such as an amino group, a phosphoric acid group, or a sulfonic acid group, but not including a hydroxyl group or an aromatic ring, is present, from the aspect of solubility of the polymer in an aqueous alkali solution and defoaming in etching. The preferred range of the polar group density is in average of 0.01 to 5 in 500 units of the molecular weight of the polymer. When the polar group density is less than 0.01, the solubility in the aqueous solution and the defoaming are likely to be lowered, and when the polar group density exceeds 5, the pyramidal shapes in the semiconductor substrate for solar cells are likely to lose uniformity.

Factors such as molecular weight, constituting units, kinds and density of polar groups, and kinds of main chain of the above polymer and derivatives thereof are important factors in playing essential role for the etching agent of the present invention.

The concentration of the polyhydroxystyrene component in the etching agent of the present invention, in other words, "at least one hydroxystyrene polymer represented by the general formula (1)," is, for example, preferably within a range of from 1 to 50,000 ppm, more preferably within a range of 10 to 30,000 ppm, and even more preferably within a range of from 50 to 10,000 ppm. The concentration is preferably 1 ppm or more, from the viewpoint of effectively removing air bubbles generated during the etching treatment, and further efficiently forming ruggedness, particularly pyramidal shapes, on a substrate surface, and the concentration is preferably 50,000 ppm or less, from the viewpoint of securance of etching rate and quality of surface appearance.

The ligninsulfonic acid or a ligninsulfonate is a compound in which pulp waste liquid which is a by-product during the manufacture of pulp is treated by various methods, the main component of which is a ligninsulfonic acid or a ligninsulfonate. As to the chemical structure of the lignin, the compound has a phenylpropane group as a basic backbone, in which the backbone takes a three-dimensional network structure.

The ligninsulfonic acid or a ligninsulfonate has been given various names depending upon the isolation methods. For example, those in which lignin is obtained as a residue include lignin sulfate, lignin hydrochloride, copper oxide ammonium lignin, lignin periodate, and the like. Those in which lignin is dissolved and obtained include 1) those dissolved in an inorganic reagent: a ligninsulfonic acid, an alkali lignin, thiolignin, and chlorolignin; 2) those dissolved in an acidic organic reagent: an alcohol lignin, dioxane lignin, phenol lignin, thioglycolate lignin, lignin acetate, hydrotropic lignin; 3) those dissolved in a hydrochloric organic reagent: Brauns natural lignin, acetone lignin, Nord lignin, Bjorkman lignin, and the like. In the present invention, a ligninsulfonic acid or a salt thereof obtained by sulfonation of the above isolated lignin or a derivative thereof as a raw material may be used. Besides the above, a ligninsulfonic acid or a ligninsulfonate which is chemically modified by increasing the carboxyl groups by oxidization treatment can be used in the present invention. The ligninsulfonic acid and a ligninsulfonate which can be used in the present invention may contain impurities upon manufacture of pulp, and an amount thereof is the smaller the more preferred. When the impurities are too much, a part of pyramids undergoes shape deformation, so that uniformity of the pyramidal shapes is likely to be lost.

The ligninsulfonic acid and the ligninsulfonate have been manufactured and sold under very many trade names from various manufacturers for pulp. The molecular weight is also in a wide range of from 180 to 1,000,000, including a variety of them with various degrees of sulfonation, various salts, those that are chemically modified, those adjusted by heavy metal ions, and the like. The present inventors have found that not all those various ligninsulfonic acids and salts thereof are suitable for the purpose of the present invention, and the effects thereof are in variance, and that when using a certain ligninsulfonic acid or a salt thereof, isotropic etching of the silicon semiconductor substrate is favorably progressed, thereby favorably forming rugged structures (pyramidal shapes), whereby the accomplishment of the object of the present invention is greatly improved.

In other words, the ligninsulfonic acid or a salt thereof which can be preferably used in the present invention satisfies all of the following conditions 1) to 3):

1) One containing a low molecular component having a molecular weight of less than 1,000 and a high molecular component having a molecular weight of 100,000 or more in a very small amount, or having those components completely removed. Specifically, the peak of the molecular weight distribution falls between 1,000 and 100,000, and preferably between 2,000 and 60,000, and at least 50% by mass of the components exist within this molecular weight range.

2) One having a sulfonate group density (i.e. degree of sulfonation) in average of 0.6 or more and less than 3 per 500 units of the molecular weight.
3) One having zero to three carboxyl groups per 500 units of the molecular weight.

Here, the measurements of the molecular weight and the molecular weight distribution of the above 1) are carried out by GPC (gel permeation chromatography) method shown hereinbelow.

(a) Preparation of Samples
Water of the same mass is added to a sample to provide a sample for GPC.
(b) Column
(b-1) In a case of a ligninsulfonic acid or a salt thereof, the columns are constructed by one guard column TSX (manufactured by Tosoh Corporation) HXL (6.5 mmφ×4 cm), one TSK3000HXL (7.8 mmφ×30 cm), and one TSK2500HXL (7.8 mmφ×30 cm). From the injection inlet side, it is connected in the order of guard column-3000HXL-2500HXL.
(b-2) In a case of a hydroxystyrene polymer, it is constructed by four columns of TSXgel (manufactured by Tosoh Corporation), SuperHZ1000.
(c) Standard Substances
Polystyrenes (manufactured by Tosoh Corporation) are used.
(d) Eluate
In a case of a ligninsulfonic acid or a salt thereof, water is used, and in a case of a hydroxystyrene polymer, tetrahydrofuran (THF) is used.
(e) Column Temperature
The temperature is room temperature (25° C.).
(f) Detector
A UV (ultraviolet spectrophotometer) is used. The quantification is carried out at a wavelength corresponding to a maximum ultraviolet peak of phenol.
(g) Division Method for Calculation of Molecular Weights
It is a time division of 2 seconds.

The kinds of the ligninsulfonate which can be used in the present invention are not particularly limited, and any one of Na salts, K salts, Ca salts, ammonium salts, Cr salts, Fe salts, Al salts, Mn salts, and Mg salts of the above ligninsulfonic acid can be used in the present invention.

In addition, in the above ligninsulfonic acid or a salt thereof, those in which heavy metal ions of Fe, Cr, Mn, Mg, Zn, or Al are chelated thereto can be used in the present invention.

Preferably, so long as the above conditions 1) to 3) are satisfied, a ligninsulfonic acid or a salt thereof in which other organic compound such as naphthalene or phenol or an organic polymer is added thereto can also be used in the present invention.

The concentration of "at least one member selected from the group consisting of ligninsulfonic acids and salts thereof" in the etching agent of the present invention of, for example, within a range of from 0.001 to 10,000 ppm can be preferably used. The concentration is preferably 0.001 ppm or more, more preferably 0.1 ppm or more, even more preferably 2 ppm or more, and even more preferably 20 ppm or more, from the viewpoint of effectively removing air bubbles generated during the etching treatment, and further efficiently forming ruggedness, particularly pyramidal shapes, on a substrate surface. On the other hand, the concentration is preferably 10,000 ppm or less, more preferably 1,000 ppm or less, and more preferably 500 ppm or less, from the viewpoint of uniformly sizing the formed ruggedness, particularly pyramidal shapes, and etching rate.

The ligninsulfonic acid and a salt thereof may be used alone or in a combination of two or more kinds.

Since the above alkaline etching agent further contains at least one member of components selected from the group consisting of the following chelating agents, silicic acid and silicates, it is preferable because the initial rise property and the texture quality can be improved.

The chelating agent which can be preferably used in the present invention is an organic chelating compound. The organic chelating compound includes a chelating compound containing within a molecule a carboxyl group and/or a carboxylate group and/or a salt thereof, a chelating compound containing within a molecule a phosphonic acid (salt thereof) group or phosphoric acid (salt thereof) group and/or a salt thereof, and other chelating compounds. Specific examples of the chelating agent which can be preferably used in the present invention will be listed hereinbelow.

The chelating compound and/or a salt thereof containing a carboxyl group and/or a carboxylate group within a molecule includes a hydroxycarboxylic acid having a hydroxyl group and/or a salt thereof, and a carboxylic acid without having a hydroxyl group and/or a salt thereof. The hydroxycarboxylic acid and/or a salt thereof includes citric acid (salt thereof), lactic acid (salt thereof), gallic acid (salt thereof), and the like. The carboxylic acid without having a hydroxyl group and/or a salt thereof includes ethylenediaminetetraacetic acid (salt thereof), diethylenetriaminepentaacetic acid (salt thereof), hydroxyethyl-iminodiacetic acid (salt thereof), 1,2-diaminocyclohexanetetraacetic acid (salt thereof), triethylenetetraminehexaacetic acid (salt thereof), nitrilotriacetic acid (salt thereof), β-alaninediacetic acid (salt thereof), aspartate diacetic acid (salt thereof), methylglycine diacetic acid (salt thereof), iminodisuccinic acid (salt thereof), serine diacetic acid (salt thereof), aspartic acid (salt thereof) and glutamic acid (salt thereof), pyromellitic acid (salt thereof), benzopolycarboxylic acid (salt thereof), cyclopentanetetracarboxylic acid (salt thereof), and the like, and further carboxymethyl oxysuccininate, oxydisuccinate, maleic acid derivatives, oxalic acid (salt thereof), malonic acid (salt thereof), succinic acid (salt thereof), glutaric acid (salt thereof), adipic acid (salt thereof), and the like.

The chelating agent containing within a molecule a phosphonic acid (salt thereof) group or phosphoric acid (salt thereof) group and/or a salt thereof includes methyldiphosphonic acid (salt thereof), aminotri(methylenephosphonic acid) (salt thereof), 1-hydroxyethylidene-1,1-diphosphonic acid (salt thereof), nitrilotrismethylene phosphonic acid (salt thereof), ethylenediaminetetra(methylenephosphonic acid) (salt thereof), hexamethylenediaminetetra(methylenephosphonic acid) (salt thereof), propylenediaminetetra(methylenephosphonic acid) (salt thereof), diethylenetriaminepenta (methylenephosphonic acid) (salt thereof), triethylenetetraminehexa(methylenephosphonic acid) (salt thereof), triaminotriethylaminehexa(methylenephosphonic acid) (salt thereof), trans-1,2-cyclohexanediaminetetra (methylenephosphonic acid) (salt thereof), glycol ether diaminetetra(methylenephosphonic acid) (salt thereof) and tetraethylenepentaminehepta(methylenephosphonic acid) (salt thereof), metaphosphoric acid (salt thereof), pyrophosphoric acid (salt thereof), tripolyphosphoric acid (salt thereof) and hexametaphosphoric acid (salt thereof), and the like.

Other chelating agents include N,N'-bis(salicylidene)-1,2-ethanediamine, N,N'-bis(salicylidene)-1,2-propanediamine, N,N'-bis(salicylidene)-1,3-propanediamine, and N,N'-bis(salicylidene)-1,4-butanediamine, ascorbic acid (salt thereof), and the like.

When a chelating compound forms a salt, a salt thereof includes those mentioned above. The chelating compound as used herein may be used alone or in combination of two or more kinds.

One preferred embodiment of the chelating agent which can be used in the alkaline etching agent for treating a surface of a semiconductor substrate for solar cells of the present invention includes, for example, one or more organic chelating compounds selected from the following group of nitrilotriacetic acid, ethylenediaminetetraacetic acid, diethylenetriaminepentaacetic acid, triethylenetetraminehexaacetic acid, methyldiphosphonic acid, aminotri(methylenephosphonic acid), 1-hydroyethylidene-1,1-diphosphonic acid, nitrilotris(methylenephosphonic acid), ethylenediaminetetra(methylenephosphonic acid), hexamethylenediaminetetra(methylenephosphonic acid), propylenediaminetetra(methylenephosphonic acid), diethylenetriaminepenta(methylenephosphonic acid), triethylenetetraminehexa(methylenephosphonic acid), and triaminotriethylaminehexa(methylenephosphonic acid), and salts thereof.

It is preferable that the concentration of the chelating agent in the etching agent of the present invention is, but not particularly limited to, from 1 to 50,000 ppm. The above concentration is preferably 1 ppm or more, for the reasons of controlling the disordered Tex shapes, and the above concentration is preferably 50,000 ppm or less, for the reasons of securance of the amount etched. More preferred ranges of the above concentration is from 1 to 10,000 ppm, and more preferably from 2 to 5,000 ppm, within which range it is also effective from the aspect of storage stability of the manufactured article.

By using the specified chelating agent mentioned above, the metal ions in the etching agent can be sequestered, whereby consequently a semiconductor substrate having high-performance rugged shapes in which the lowering of the light absorption efficiency or the lowering of power generation efficiencies is prevented can be produced.

It is preferable that the kinds of silicic acid and/or silicates which can be contained in the etching agent of the present invention are, but not particularly limited to, at least one member selected from the group consisting of metallic silicon, silica, silicic acid, and silicates.

The silicate is preferably a silicate of an alkali metal, including, for example, sodium silicates such as sodium orthosilicate ($Na_4SiO_4 \cdot nH_2O$) and sodium metasilicate ($Na_2SiO_3 \cdot nH_2O$), potassium silicates such as $K_4SiO_4 \cdot nH_2O$ and $K_2SiO_3 \cdot nH_2O$, lithium silicates such as $Li_4SiO_4 \cdot nH_2O$ and $Li_2SiO_3 \cdot nH_2O$, and the like. As these silicates a compound itself can be added to the etching agent and used, or a silicate compound obtained as a reaction product by directly dissolving a silicon material such as a silicon wafer, a silicon ingot or a silicon cutting powder, or silicon dioxide in an alkaline agent may be used as a silicate. In the present invention, JIS No. 1 silicate is preferred from the viewpoint of availability.

The content of the silicic acid or silicate in the etching agent of the present invention (a content of silicic acid in a case where only silicic acid is contained, a content of the silicate in a case where only a silicate is contained, or a total amount of silicic acid and a silicate in a case where these compounds are contained) is, but not particularly limited to, preferably from 0.01 to 10% by mass, more preferably from 0.1 to 5% by mass, and even more preferably from 0.2 to 3% by mass. When the above silicon material or silicon dioxide is dissolved and supplied, it is preferred that the content is within the above concentration range calculated as Si atoms.

The content of the above silicic acid and/or silicate influences the stability of the etching rate. The content of the silicic acid and/or silicate at which the etching rate is stabilized varies depending upon the conditions such as the concentration of the alkaline agent mentioned later, and the temperature of the etching agent during etching. Therefore, the optimal content of the silicic acid and/or silicate may be determined depending on a concentration of an alkaline agent or the like.

The alkaline agent is an essential component for forming pyramidal ruggedness on a substrate surface when the substrate surface is etched with an etching agent.

The kinds of the alkaline agent to be contained in the etching agent of the present invention are not particularly limited, and any one of organic alkalis and inorganic alkalis can be used. It is preferable that the organic alkali is, for example, tertiary ammonium salts such as tetramethylammonium hydroxide, an alkanolamine, and the like. The inorganic alkali is preferably hydroxides of alkali metals or alkaline earth metals, such as sodium hydroxide, potassium hydroxide, and calcium hydroxide, and sodium hydroxide or potassium hydroxide is especially preferred. These alkaline agents may be used alone or in a mixture of two or more kinds.

The alkali concentration in the etching agent is, but not particularly limited to, preferably from 0.5 to 50% by mass, more preferably from 1 to 30% by mass, and even more preferably from 2 to 20% by mass. Especially when the alkali concentration is 0.5% by mass or more, the durability of the etching agent is remarkably increased, so that ruggedness of a desired size can be uniformly formed on a substrate surface, even when the etching agent is repeatedly used. When the concentration exceeds 50% by mass, the viscosity of a solution in which the hydroxystyrene polymer is dissolved becomes high, thereby making it undesirably difficult to handle the etching agent.

The etching agent of the present invention may contain other components within the range that would not impair the effects. For example, the effects of including a hydroxystyrene polymer (incorporating the incidence of light more efficiently into the substrate) can be increased by including an amino acid, a high-molecular polymer, a glycol ether or the like as an aid. In addition, it is preferable that the solvent for the etching agent of the present invention is water.

The method for preparing an etching agent of the present invention is not particularly limited, and a conventionally known method can be employed. As the components for the etching agent of the present invention, it is preferable that the components upon use are within the above component ranges, but it is possible to prepare concentrated products of the components upon shipment, with the intention of reducing transportation costs. It is preferable that the concentration upon shipment is three times or more.

In addition, the effects of restoring ruggedness formation strength in pyramidal shapes are high by adding an aqueous alkali solution in which a hydroxystyrene polymer is dissolved to an etching agent which is gradually deteriorated by subjecting a semiconductor substrate for solar cells to an etching treatment with the etching agent of the present invention. For example, a high-quality ruggedness structure can be stably obtained by adding the aqueous alkali solution in an amount of from 5 to 50% by volume or so of the initial blending amount with a given interval of etching. Therefore, the aqueous alkali solution of the hydroxystyrene polymer in the present invention can be used as an etching ability restoring agent.

The composition of the etching ability recovering agent of the present invention contains a hydroxystyrene polymer represented by the general formula (1) defined above and the above alkaline agent, and more preferably further containing at least one member selected from the group consisting of ligninsulfonic acids, salts of the ligninsulfonic acids, the above chelating agents, the above silicic acid, and salts of the silicic acid.

The etching ability can be restored by adding an alkaline agent to an etching agent which is previously deteriorated by repeatedly treating a semiconductor substrate for solar cells. Furthermore, in order to improve the uniformity of the pyramidal shapes and the uniformity of the plane overall, a hydroxystyrene polymer represented by a general formula (1) defined above is added together with an alkaline agent, thereby the number of batches of the etching treatments can be increased without exchanging the deteriorated etching agent. Since the initial vat etching agent can be continuously used, it has the effects of increasing the industrial value.

The method for producing a semiconductor substrate for solar cells of the present invention includes an etching step of etching a substrate surface of a semiconductor substrate for solar cells with an etching agent of the present invention, thereby forming ruggedness on the substrate surface.

The semiconductor substrate for solar cells are preferably monocrystalline silicon substrates and polycrystalline silicon substrates (regardless of p-type, n-type), but the semiconductor substrate of a monocrystalline using a semiconductor compound of copper-indium, gallium-arsenide or the like can also be used. The cutting method of a silicon ingot used as a raw material of a semiconductor substrate to be etched includes, but not particularly limited to, loose abrasive methods and bonded abrasive methods, and the bonded abrasive methods are preferred from the viewpoint of productivity.

In the etching step, a method of contacting an etching agent of the present invention with a substrate surface is, but not particularly limited to, preferably a method of immersing a semiconductor substrate for solar cells in an etching agent. The method of production of the present invention will be described hereinbelow by taking a method of immersion as an example.

The etching step according to an method of immersion refers to, for example, a step of placing an etching agent of the present invention in a given vessel, and immersing a semiconductor substrate for solar cells in the vessel.

The temperature of the etching agent within the above vessel in the etching step is not particularly limited and can be appropriately set, and the temperature is preferably within a range of from 70° to 98° C., and more preferably within a range of 80° to 95° C., when taking production and quality into consideration.

Also, the immersion time of the semiconductor substrate for solar cells to the etching agent in the etching step is not particularly limited and can be appropriately set, and the immersion time is preferably from 5 to 40 minutes, and more preferably within a range of from 10 to 30 minutes, when taking production and quality into consideration.

According to the method of the present invention, in a case of a monocrystalline silicon substrate, since the etching agent of the present invention is used, pyramidal ruggedness of desired sizes can be uniformly formed on a substrate surface of semiconductor substrates for solar cells continuously in a greater number than a conventional method. Further, one having a composition of the etching agent of the present invention can be added to an etching vessel as an etching ability restoring agent for restoring etching ability.

As described above, it is preferable because the number of continuous use of the etching treatment can be increased by using the etching ability restoring agent. In a case of a polycrystalline silicon substrate, although the sizes and shapes of the pyramids respectively differ depending upon crystal orientation, pyramidal ruggedness can be uniformly formed in each of crystal orientations. In addition, the use of an etching agent of an alkali type of the present invention is advantageous in working environment, safety, and costs of waste liquid treatment, as compared with a mixed acid of hydrofluoric acid and nitric acid, which has been conventionally used when etching a polycrystalline silicon substrate.

According to the method of the present invention described above, an average size of pyramidal shapes formed on a surface of the semiconductor surface for solar cells after etching can be adjusted to from 0.5 to 30 μm.

According to the method of the present invention described above, an optical reflectivity of the semiconductor substrate for solar cells after etching can be greatly lowered. Specifically, the optical reflectivity of the semiconductor substrate for solar cells (monocrystalline silicon substrate) after etching at a wavelength of 600 nm can be lowered to preferably 10% or less. In addition, the optical reflectivity of the semiconductor substrate for solar cells (polycrystalline silicon substrate) after etching at a wavelength of 600 nm can be lowered to preferably 25% or less. The method for measuring an optical reflectivity is as described later.

The semiconductor substrate for solar cells produced by the method of the present invention is a semiconductor substrate for solar cells produced by using the etching agent of the present invention, and in a monocrystalline silicon substrate, even pyramidal ruggedness in which on the substrate surface a largest side of the bottom is preferably from 1 to 30 μm, more preferably its upper limit is 25 μm, and even more preferably its upper limit is 20 μm, is formed. Further, according to the present invention, a semiconductor substrate for solar cells having a low reflectivity can be obtained in high productivity. If the etching agent of the present invention is used, the above-defined ruggedness of desired sizes can be uniformly formed on a substrate surface than in a case where a conventionally etching agent is used. In addition, in a polycrystalline silicon substrate, uniform pyramidal ruggedness in which on the substrate surface a largest side of the bottom is preferably from 0.5 to 30 μm, more preferably from 0.5 to 10 μm, and even more preferably from 0.5 to 5 μm, is formed. Here, the pyramidal ruggedness refers to ruggedness formed by lining projections of pyramidal shapes (quadrangular pyramidal form) on a substrate surface for solar cells.

The sizes of the pyramidal shapes formed on the substrate surface in their average sizes are preferably from 0.5 to 30 μM, more preferably from 1 to 10 μm, and even more preferably from 1 to 5 μm. It is preferable that the average sizes are 0.5 μm or more, from the viewpoint of reduction in optical reflectivity, and the average sizes are 30 μm or less, from the viewpoint of productivity. The pyramidal shapes of the above average sizes can be accomplished by the method of the present invention using the etching agent of the present invention.

One of the features of the semiconductor substrate for solar cells of the present invention is in that the optical reflectivity is very small. For example, in a case of a monocrystalline silicon substrate, the silicon substrate has an optical reflectivity at a wavelength of 600 nm of preferably 10% or less, more preferably 9.5% or less, and even more preferably 9.0% or less. In a case of a polycrystalline silicon substrate, the silicon substrate has an optical reflectivity at a wavelength of 600 nm of preferably 25% or less, more preferably 23% or less, and even more preferably 15% or less. The method for measuring an optical reflectivity is as described later.

As mentioned above, on the surface of the semiconductor substrate for solar cells which is subjected to an etching treatment with the etching agent of the present invention, pyramidal shaped ruggedness of desired sizes are formed without flat surface. Therefore, a surface of the semiconductor substrate for solar cells which is subjected to an etching treatment with a conventionally known etching agent and the surface of the semiconductor substrate for solar cells which is subjected to an etching treatment with the etching agent of the present invention can be distinguished by the variances of the sizes of pyramidal shaped ruggedness or sizes of the distances between the pyramidal shaped projections, and the like.

Further, a solar cell can be produced by a known method using a semiconductor substrate for solar cells of the present invention. The solar cell comprising a semiconductor substrate for solar cells as described above is also embraced in the present invention.

EXAMPLES

The present invention will be described more specifically hereinbelow by means of Examples, and these Examples are intended to be illustratively given.

Examples 1 to 43 and Comparative Examples 1 to 9

An n-type monocrystalline silicon substrate (a square of 156 mm each side, thickness of 150 μm) having a crystal orientation (100) plane as a surface was immersed in an etching agent previously prepared in accordance with a blending composition listed in Table 1 at 80° to 90° C. for 15 to 30 minutes. The substrate surface after the etching treatment was observed visually, with a laser microscope, and with a scanning electron microscope. The results are shown in Table 1. The chelating agents used were DTPA (diethylenetriaminepentaacetic acid) and HEDP (1-hydroxyethylidene-1,1-diphosphonic acid), each of which was abbreviated as A or B in the tables. Here, the specific procedures for etching treatment were as described in [Etching Treatment] set forth below. The pH of each of the etching agents in Examples 1 to 43 and Comparative Examples 1 to 9 at 25° C. was within a range of from 12 to 14.

Examples 45 to 56 and Comparative Example 10

The same procedures as in Example 1 were carried out except that a p-type polycrystalline silicon substrate (bonded abrasive cut product, a square of 156 mm each side, thickness of 200 μm) was used in an etching agent previously prepared in a blending composition listed in Table 1, and that the chelating agents were DTPA and sodium ascorbate (each abbreviated as A or C in the tables). The pH of each of the etching agents in Examples 45 to 56 and Comparative Example 10 at 25° C. was within a range of from 12 to 14. As the polycrystalline silicon substrate, two kinds of a polycrystalline A type (usual polycrystalline Si) and a polycrystalline B type (mono-like Si: a polycrystalline which is a type in which sizes of the crystal grains are grown so that 100≤plane occupies the majority of the surface). The polycrystalline B type was used in Examples 48 and 49, and the polycrystalline A type was used in all the other examples.

Comparative Examples 11 and 12

The same procedures as in Example 45 were carried out except that the components of the etching agent containing a 46% hydrofluoric acid, a 60% nitric acid, and pure water in a volume ratio of 1:3:3. The pH of each of the etching agents of Comparative Examples 11 and 12 at 25° C. was 1 or less.

TABLE 1-1

| | KOH % by weight | Polyhydroxy-styrene Component | | Sodium Lignin-sulfonate | | Chelating Agent | | No. 1 Silicate % by weight | Temp. ° C. | Time min | Reflectivity (600 nm) % |
|---|---|---|---|---|---|---|---|---|---|---|---|
| | | Kinds | ppm | Kinds | ppm | Kinds | ppm | | | | |
| Ex. 1 | 0.5 | a | 1 | — | — | — | — | — | 90 | 20 | 11.8 |
| Ex. 2 | 1 | a | 10 | — | — | — | — | 0.1 | 85 | 20 | 11.0 |
| Ex. 3 | 0.5 | a | 100 | — | — | — | — | 0.1 | 85 | 20 | 11.8 |
| Ex. 4 | 1 | a | 100 | — | — | — | — | 0.1 | 85 | 20 | 11.3 |
| Ex. 5 | 2 | a | 100 | A | 100 | — | — | — | 85 | 20 | 12.9 |
| Ex. 6 | 3 | a | 100 | — | — | — | — | — | 85 | 20 | 12.7 |
| Ex. 7 | 1 | a | 1,000 | — | — | — | — | — | 85 | 20 | 10.0 |
| Ex. 8 | 2 | a | 1,000 | — | — | — | — | — | 85 | 20 | 9.3 |
| Ex. 9 | 2 | a | 1,000 | — | — | B | 500 | — | 85 | 20 | 9.4 |
| Ex. 10 | 3 | a | 1,000 | A | 100 | A | 50 | — | 85 | 20 | 11.4 |
| Ex. 11 | 4 | a | 1,000 | A | 100 | A | 100 | — | 90 | 15 | 11.1 |
| Ex. 12 | 5 | a | 1,000 | A | 100 | — | — | — | 90 | 15 | 14.5 |
| Ex. 13 | 2 | a | 3,000 | — | — | — | — | — | 80 | 15 | 9.8 |
| Ex. 14 | 7 | a | 3,000 | — | — | — | — | — | 85 | 15 | 9.9 |
| Ex. 15 | 4 | a | 3,000 | — | — | — | — | — | 85 | 15 | 9.7 |
| Ex. 16 | 3 | a | 3,000 | — | — | — | — | — | 85 | 15 | 9.4 |
| Ex. 17 | 3 | a | 3,000 | A | 20 | A | 100 | — | 85 | 15 | 9.5 |
| Ex. 18 | 3 | a | 3,000 | — | — | — | — | — | 90 | 15 | 9.3 |
| Ex. 19 | 3 | a | 3,000 | A | 20 | A | 500 | — | 90 | 15 | 9.4 |
| Ex. 20 | 15 | a | 3,000 | — | — | — | — | — | 90 | 15 | 12.5 |
| Ex. 21 | 2 | a | 5,000 | — | — | A | 500 | — | 80 | 15 | 11.1 |
| Ex. 22 | 3 | a | 5,000 | — | — | A | 1,000 | — | 85 | 15 | 10.1 |
| Ex. 23 | 4 | a | 5,000 | — | — | — | — | — | 85 | 15 | 9.9 |
| Ex. 24 | 5 | a | 5,000 | A | 50 | — | — | — | 85 | 15 | 10.6 |
| Ex. 25 | 5 | a | 5,000 | A | 50 | A | 500 | — | 85 | 15 | 10.8 |
| Ex. 26 | 7 | a | 5,000 | A | 50 | — | — | — | 85 | 15 | 10.5 |
| Ex. 27 | 9 | a | 5,000 | A | 100 | — | — | — | 85 | 15 | 10.7 |
| Ex. 28 | 3 | b | 2,000 | — | — | — | — | — | 85 | 20 | 11.0 |
| Ex. 29 | 5 | b | 5,000 | — | — | — | — | — | 85 | 20 | 11.6 |
| Ex. 30 | 9 | b | 10,000 | A | 500 | — | — | — | 85 | 20 | 12.5 |

| | Pyramidal Size μm | Etching Amount g | Shininess (Remaining on 100 Plane) | Surface Qualities | | Uniformity of Pyramidal Sizes | Storage Stability |
|---|---|---|---|---|---|---|---|
| | | | | Non-Uniformity and Streaks | Comet-Shaped Defects | | |
| Ex. 1 | 2.3 | 0.84 | B | B | B | B | Not evaluated |
| Ex. 2 | 2.1 | 1.26 | B | B | B | B | Not evaluated |
| Ex. 3 | 2.2 | 0.67 | B | B | B | B | Not evaluated |
| Ex. 4 | 1.6 | 0.84 | B | B | B | A | Not evaluated |
| Ex. 5 | 1.8 | 1.60 | B | A | A | B | Not evaluated |
| Ex. 6 | 1.5 | 1.79 | B | B | B | B | Not evaluated |
| Ex. 7 | 2.1 | 0.25 | A | B | B | A | Not evaluated |
| Ex. 8 | 2.2 | 0.43 | A | B | B | A | B |
| Ex. 9 | 2.3 | 0.35 | A | B | B | A | A |
| Ex. 10 | 2.6 | 0.46 | B | A | A | A | Not evaluated |
| Ex. 11 | 3.1 | 0.60 | A | A | A | A | Not evaluated |
| Ex. 12 | 2.5 | 1.17 | B | A | A | B | Not evaluated |
| Ex. 13 | 2 | 0.18 | A | B | B | A | Not evaluated |
| Ex. 14 | 3.2 | 0.50 | A | A | B | A | Not evaluated |
| Ex. 15 | 2.4 | 0.34 | A | B | B | A | Not evaluated |
| Ex. 16 | 2.1 | 0.29 | A | B | B | A | B |
| Ex. 17 | 2.3 | 0.26 | A | A | A | A | A |
| Ex. 18 | 2.4 | 0.31 | A | B | A | A | Not evaluated |
| Ex. 19 | 2.2 | 0.24 | A | A | A | A | Not evaluated |
| Ex. 20 | 4 | 2.70 | B | B | B | B | Not evaluated |
| Ex. 21 | 2 | 0.09 | A | B | B | B | Not evaluated |
| Ex. 22 | 1.6 | 0.10 | A | B | B | B | Not evaluated |
| Ex. 23 | 2.3 | 0.28 | A | B | B | A | Not evaluated |
| Ex. 24 | 2.4 | 0.48 | A | A | A | A | B |
| Ex. 25 | 2.5 | 0.33 | A | A | A | A | A |
| Ex. 26 | 2.9 | 0.54 | A | A | A | A | Not evaluated |
| Ex. 27 | 3.7 | 0.73 | A | A | A | A | Not evaluated |
| Ex. 28 | 2.8 | 0.38 | B | B | B | B | Not evaluated |
| Ex. 29 | 2.7 | 0.37 | B | B | B | B | Not evaluated |
| Ex. 30 | 2.1 | 0.29 | B | A | A | B | Not evaluated |

TABLE 1-2

|  | KOH % by weight | NaOH % by weight | Polyhydroxy-styrene Component Kinds | Polyhydroxy-styrene Component ppm | Sodium Lignin-sulfonate Kinds | Sodium Lignin-sulfonate ppm | Chelating Agent Kinds | Chelating Agent ppm | No. 1 Silicate % by weight | Temp. °C. | Time min | Reflectivity (600 nm) % |
|---|---|---|---|---|---|---|---|---|---|---|---|---|
| Ex. 31 | 3 | — | c | 2,000 | — | — | — | — | — | 85 | 20 | 12.3 |
| Ex. 32 | 5 | — | c | 5,000 | — | — | A | 300 | — | 85 | 20 | 12.7 |
| Ex. 33 | 7 | — | c | 10,000 | A | 300 | — | — | — | 85 | 20 | 12.9 |
| Ex. 34 | 3 | — | d | 1,000 | A | 1 | — | — | — | 90 | 15 | 10.9 |
| Ex. 35 | 3 | — | d | 2,000 | B | 2 | — | — | — | 90 | 15 | 10.6 |
| Ex. 36 | 2 | — | d | 3,000 | C | 5 | — | — | — | 90 | 15 | 10.8 |
| Ex. 37 | 5 | — | e | 100 | A | 0.1 | — | — | — | 90 | 15 | 11.6 |
| Ex. 38 | 5 | — | e | 300 | D | 0.1 | — | — | — | 85 | 20 | 11.8 |
| Ex. 39 | 5 | — | e | 500 | A | 0.1 | — | — | — | 85 | 20 | 11.3 |
| Ex. 40 | 7 | — | f | 2 | A | 500 | — | — | — | 90 | 15 | 11.7 |
| Ex. 41 | 2 | — | g | 2 | A | 10 | A | 300 | — | 90 | 15 | 12.1 |
| Ex. 42 | 2 | — | g | 100 | B | 10 | A | 300 | — | 85 | 20 | 11.8 |
| Ex. 43 | 7 | — | h | 10 | A | 500 | — | — | — | 85 | 20 | 12.3 |
| Ex. 45 | 2 | — | a | 2,000 | A | 20 | C | 50,000 | — | 90 | 15 | 23.5 |
| Ex. 46 | 3 | — | a | 3,000 | A | 20 | C | 50,000 | — | 90 | 15 | 22.1 |
| Ex. 47 | 3 | — | a | 3,000 | A | 20 | — | — | — | 90 | 15 | 24.0 |
| Ex. 48* | 3 | — | b | 3,000 | A | 20 | C | 50,000 | — | 90 | 15 | 9.8 |
| Ex. 49* | 3 | — | b | 3,000 | A | 20 | — | — | — | 90 | 15 | 10.5 |
| Ex. 50 | 3 | — | b | 4,000 | C | 50 | C | 50,000 | — | 90 | 15 | 22.6 |
| Ex. 51 | 5 | — | a | 5,000 | A | 100 | C | 50,000 | — | 90 | 15 | 23.3 |
| Ex. 52 | 7 | — | b | 5,000 | B | 50 | A | 300 | — | 90 | 15 | 23.7 |
| Ex. 53 | — | 3 | b | 1,000 | — | — | — | — | — | 90 | 15 | 20.4 |
| Ex. 54 | — | 3 | b | 3,000 | — | — | — | — | — | 90 | 15 | 22.4 |
| Ex. 55 | — | 5 | a | 3,000 | A | 20 | — | — | — | 90 | 15 | 23.5 |
| Ex. 56 | — | 3 | c | 4,000 | A | 20 | — | — | — | 90 | 15 | 23.5 |

|  | Pyramidal Size μm | Etching Amount g | Surface Qualities Shininess (Remaining on 100 Plane) | Surface Qualities Non-Uniformity and Streaks | Surface Qualities Comet-Shaped Defects | Uniformity of Pyramidal Sizes | Storage Stability |
|---|---|---|---|---|---|---|---|
| Ex. 31 | 2.5 | 0.75 | B | B | B | B | Not evaluated |
| Ex. 32 | 2.3 | 0.51 | B | B | B | B | Not evaluated |
| Ex. 33 | 1.8 | 0.53 | B | A | A | B | Not evaluated |
| Ex. 34 | 3 | 0.71 | B | B | B | A | Not evaluated |
| Ex. 35 | 2.8 | 0.56 | B | B | B | A | Not evaluated |
| Ex. 36 | 2.3 | 0.36 | B | B | A | A | Not evaluated |
| Ex. 37 | 1.8 | 0.23 | B | B | B | B | Not evaluated |
| Ex. 38 | 1.6 | 0.08 | B | B | B | B | Not evaluated |
| Ex. 39 | 1.5 | 0.02 | B | B | B | B | Not evaluated |
| Ex. 40 | 3.7 | 0.68 | A | A | A | B | Not evaluated |
| Ex. 41 | 2.1 | 0.55 | B | B | A | B | Not evaluated |
| Ex. 42 | 2.3 | 0.26 | B | B | A | B | Not evaluated |
| Ex. 43 | 3.9 | 0.52 | A | A | A | B | Not evaluated |
| Ex. 45 | 1.5 | 0.17 | — | A | A | A | Not evaluated |
| Ex. 46 | 1.3 | 0.16 | — | A | A | A | Not evaluated |
| Ex. 47 | 2.3 | 0.47 | — | A | A | A | Not evaluated |
| Ex. 48* | 1.3 | 0.36 | — | A | A | A | Not evaluated |
| Ex. 49* | 2.3 | 0.41 | — | A | A | A | Not evaluated |
| Ex. 50 | 1.4 | 0.10 | — | A | A | A | Not evaluated |
| Ex. 51 | 1.4 | 0.09 | — | A | A | A | Not evaluated |
| Ex. 52 | 1.5 | 0.13 | — | A | A | A | Not evaluated |
| Ex. 53 | 0.9 | 1.25 | — | A | A | A | Not evaluated |
| Ex. 54 | 1.1 | 0.44 | — | A | A | A | Not evaluated |
| Ex. 55 | 1.7 | 0.52 | — | A | A | A | Not evaluated |
| Ex. 56 | 1.5 | 0.48 | — | A | A | A | Not evaluated |

Note:
*(Polycrystalline mono-like)

TABLE 1-3

|  | KOH % by weight | NaOH % by weight | Polyhydroxy-styrene Component Kinds | Polyhydroxy-styrene Component ppm | Sodium Lignin-sulfonate Kinds | Sodium Lignin-sulfonate ppm | Chelating Agent Kinds | Chelating Agent ppm | No. 1 Silicate % by weight | Temp. °C. | Time min | Reflectivity (600 nm) % |
|---|---|---|---|---|---|---|---|---|---|---|---|---|
| Comp. Ex. 1 | 8 | — | — | Heptanoic acid*1 | — | — | — | — | — | 85 | 25 | 11.8 |

TABLE 1-3-continued

| | | | | | | | | | | | |
|---|---|---|---|---|---|---|---|---|---|---|---|
| Comp. Ex. 2 | 4 | — | — | IPA*2 | — | — | — | — | — | 85 | 30 | 12.0 |
| Comp. Ex. 3 | 7 | — | — | — | E | 400 | — | — | — | 85 | 15 | 12.3 |
| Comp. Ex. 4 | 7 | — | — | — | F | 4000 | — | — | — | 90 | 15 | 12.1 |
| Comp. Ex. 5 | 3 | — | i | 3,000 | — | — | — | — | — | 85 | 20 | 28.1 |
| Comp. Ex. 6 | 5 | — | j | 3,000 | — | — | — | — | — | 85 | 20 | 34.2 |
| Comp. Ex. 7 | 3 | — | — | — | G | 100 | — | — | — | 85 | 20 | 17.5 |
| Comp. Ex. 8 | 3 | — | j | 3,000 | G | 100 | — | — | — | 85 | 20 | 15.3 |
| Comp. Ex. 9 | 3 | — | — | — | E | 100 | — | — | — | 85 | 20 | 14.3 |
| Comp. Ex. 10 (IPA) | 4 | — | — | IPA*2 | — | — | — | — | — | 85 | 20 | 30.1 |
| Comp. Ex. 11* | — | — | — | — | — | — | — | — | — | 7 | 3 | 25.8 |
| Comp. Ex. 12** | — | — | — | — | — | — | — | — | — | 7 | 3 | 32.2 |

| | Pyramidal Size μm | Etching Amount g | Shininess (Remaining on 100 Plane) | Surface Qualities | | | Uniformity of Pyramidal Sizes | Storage Stability |
|---|---|---|---|---|---|---|---|---|
| | | | | Non-Uniformity and Streaks | Comet-Shaped Defects | | | |
| Comp. Ex. 1 | 10.6 | 1.62 | C | B | C | | B | Not evaluated |
| Comp. Ex. 2 | 13.4 | 0.60 | C | C | C | | C | Not evaluated |
| Comp. Ex. 3 | 4.5 | 0.58 | C | C | C | | C | Not evaluated |
| Comp. Ex. 4 | 15 | 0.63 | C | C | C | | C | Not evaluated |
| Comp. Ex. 5 | 7.2 | 2.30 | D | C | D | | C | Not evaluated |
| Comp. Ex. 6 | 1.5 | 3.05 | D | D | C | | C | Not evaluated |
| Comp. Ex. 7 | 1.8 | 1.11 | D | D | D | | D | Not evaluated |
| Comp. Ex. 8 | 2.5 | 0.08 | C | C | B | | C | Not evaluated |
| Comp. Ex. 9 | 2.6 | 0.89 | C | C | C | | C | Not evaluated |
| Comp. Ex. 10 (IPA) | 22.4 | 1.79 | C | C | C | | C | Not evaluated |
| Comp. Ex. 11* | — | — | A | A | A | | — | Not evaluated |
| Comp. Ex. 12** | — | — | A | A | A | | — | Not evaluated |

*1Containing 1% by mass of heptanoic acid in place of the polyhydroxystyrene polymer.
*2Containing 4% by mass of isopropanol in place of the polyhydroxystyrene polymer.
*Acid Etching, Polycrystalline, Loose
**Acid Etching, Polycrystalline, Bonded Example 44

With regard to staminal property (continuous use) of the etching agent, a plural number of the above silicon substrates were set on a cassette for substrate support (at most 30 disks/cassette) to the original etching agent having a liquid volume of 30 L, and plural batches of treatment were carried out in which one batch is defined as the set cassette. During that treatment, since the consumption of the alkali was tremendously large, the consumed KOH was determined by an automatic titration apparatus, and KOH of a corresponding amount was resupplied every batch. The composition of the original etching agent and the evaluation results is listed in Table 2. Here, the procedures for the specific etching treatment were as described in [Etching Treatment] set forth below. The pH of the etching agent in Example 44 at 25° C. was 13.5.

TABLE 2-1

| | Number of Batches of Continuous Use | KOH % by weight | Polyhydroxy-styrene Component | | Lignin-sulfonate | | Chelating Agent |
|---|---|---|---|---|---|---|---|
| | | | Kinds | ppm | Kinds | ppm | ppm |
| Ex. 44 | 1 | 3 | a | 2000 | A | 20 | — |
| | 10 | 3 | a | 2000 | A | 20 | — |
| | 35 | 3 | a | 2000 | A | 20 | — |

TABLE 2-2

|  | Number of Batches of Continuous Use | Reflectivity % | Pyramidal Size | Etching Amount g/ both sides | Shininess | Surface Qualities Non-Uniformity and Streaks | Comet-Shaped Defects | Uniformity of Pyramidal Sizes |
|---|---|---|---|---|---|---|---|---|
| Ex. 44 | 1 | 9.3 | 2.3 | 0.77 | A | A | A | A |
|  | 10 | 9.6 | 2.1 | 0.85 | A | A | A | A |
|  | 35 | 9.9 | 1.8 | 0.94 | A | A | A | A |

Table 2 lists an example where the evaluation of a substrate after a first batch of the etching treatment was made, an example where the evaluation of a substrate after a 10th batch of the etching treatment was made, and an example where the evaluation of a substrate after 35th batch of the etching treatment was made. In Example 44, the hydroxystyrene (the following polymer a) was added to the vessel after a 10th batch and a 20th batch of treatment, and a continuous test was continued. The amount of the polymer a added was 0.05% by mass of the etching agent of the vessel.

[Etching Treatment]

As an etching vessel, in a case of a monocrystalline silicon substrate, an about 3 L cylindrical vessel made of SUS304 was used, the cylindrical vessel was charged with 3 L of an etching agent, and the contents were heated from a bottom part with a SUS electric immersion heater, and the temperature range was maintained at a set temperature ±1° C. In a polycrystalline silicon substrate, an about 5 L cylindrical vessel made of SUS304 was used, and the cylindrical vessel was charged with 5 L of an etching agent, the contents were heated from a bottom part with an IH heater, and the temperature range was maintained at a set temperature ±1° C. The number of substrate supplied was one. The substrate was taken out from the etching agent, and the substrate was then quickly subjected to rinse cleaning under running water, and dried under hot air. The dried substrate was evaluated in accordance with the following criteria.

On the other hand, in the confirmation of the continuous use regarding Example 44, an about 35 L box-shaped vessel made of SUS304 was used, the vessel was charged with 30 L of an etching agent, the etching agent was heated from a bottom part with a SUS electric immersion heater, and stirred by a liquid circulation agitation (5 L/minute), and the temperature range was maintained at a set temperature 90° C.±1° C. The number of substrates supplied was 30. A jig was designed so as not to hamper the liquid circulation, and the substrates were inserted with an interval of 4 mm. At a time point where the treatment time reached 15 minutes, the substrates were taken out from the etching agent together with the cassette, thereafter quickly subjected to rinse cleaning under running water, and dried with hot air. The dried substrates were evaluated in accordance with the following criteria. Here, since the number of substrates was in a plurality, the evaluation of Example 44 was shown as an average of all the substrates.

Non-Uniformity and Streaks: The presence or absence of non-uniformity and streaks over an entire surface of the substrates was visually judged.

A: Free from non-uniformity in color and fine streaks, so that the entire surface is uniform.

B: In a very small section, some non-uniformity in color and fine streaks are present.

C: There are some non-uniformity in color or fine steaks.

D: Non-uniformity in color and streaks are present over the entire surface.

Shininess: Shininess is a phenomenon of surface properties in which the ruggedness of pyramidal structures is not formed, so that a (100) mirror plane still remains, thereby reflecting light to be seen as being shiny, which is evaluated by visual observation. The judgment was made by classifying a degree of shininess as follows. Here, in the present specification, only the shininess of the monocrystalline silicon substrate was evaluated.

A: No shininess. Even when observed with a laser microscope, it can be confirmed that the ruggedness of pyramidal structures fully occupy the surface.

B: No shininess. Although the shininess could not be confirmed on a visual level, a region not forming ruggedness of pyramidal structures can be confirmed when observed with a laser microscope.

C: Partly shiny.

D: Shininess is found on an entire surface.

Comet-Shaped Defects: The comet-shaped defects refer to damages of oblong droplet-like shape that are visually observed on a substrate surface after etching.

A: The comet-shaped defects as defined above do not exist on the substrate surface.

B: The comet-shaped defects as defined above are present in a proportion of within a range of less than 3% by area of the substrate surface.

C: The comet-shaped defects as defined above are present in a proportion of within a range of 3% by area or more and less than 5% by area of the substrate surface.

D: The comet-shaped defects as defined above are present in a proportion of within a range of 5% by area or more of the substrate surface.

Storage Stability: With regard to the etching agent prepared in each of Examples 8, 9, 16, 17, 24 and 25, the storage stability of the etching agent was evaluated as follows. After the preparation of the etching agent, each etching agent was stored at 40° C. for one month. Thereafter, an etching treatment was carried out with each of the stored etching agents according to a method shown in each of corresponding Examples, and the substrate surface after the treatment was evaluated. Moreover, the evaluation for the substrate surface with the etching agent before storage was compared with the evaluation of the substrate surface with the etching agent after storage, and the storage stability was evaluated in accordance with the following criteria.

A: Even when an etching agent after storage was used, hardly any deterioration in pyramidal shapes and surface external appearance (surface qualities) of the substrate surface are found.

B: When an etching agent after storage was used, slight deteriorations in uniformity of pyramidal sizes of the substrate surface are found.

C: When an etching agent after storage was used, the generation of shininess on a substrate surface is found in a small amount, and an increase in the etching amount of about 20% or more is found.

Pyramidal Sizes: In a case of a monocrystalline silicon substrate, a substrate surface was observed with a laser microscope, and 10≤pyramidal shapes from the largest were measured for the pyramidal sizes. The measurements were made in three fields of view, and an average was taken, which was defined as an average pyramidal size. A part of substrates was also observed with a scanning electron microscope. In a case of a polycrystalline silicon substrate, a substrate surface was observed with a laser microscope, and 10 pyramidal shapes from the largest pyramids standing vertically to the substrate surface were measured for the pyramidal sizes. The measurements were made in three fields of view, and an average was taken, which was defined as an average pyramidal size.

Uniformity (Variance) of Pyramidal Sizes: The uniformity was judged by an existing proportion of the smaller pyramidal sizes having sizes of 50% or less of the above average pyramidal size according to scanning electron microscopic observation (5000 fold magnification). In a polycrystalline silicon substrate, it is an existing proportion of pyramids that are standing vertically against the substrate surface.

A: Those having sizes of less than 50% of an average pyramidal size only exist in an amount of less than 20%.
B: Those defined above exist in an amount of from 20 to 40%.
C: Those defined above exist in an amount of 40% or more.
D: Flat surfaces exist between the pyramids in an amount of 10% or more.

As to the above laser microscope, photographs were taken with a laser microscope VK-X100 manufactured by KEYENCE with an objective lens of 100 folds (ocular lens of 20 folds) at a magnification of 2,000 folds, and printed out on paper sheets. Thereafter, the base sizes of the pyramids were measured and this base sizes were defined as pyramidal sizes. As to the scanning electron microscope, observation was made with SU 3500 manufactured by HITACHI LTD., at an acceleration voltage of from 2 to 5 kV.

Here, the scanning electron micrograph showing surface structures of the substrate after the etching treatment in Example 17 is shown in FIG. 1. Further, the scanning electron micrographs showing surface structures of the substrates after the etching treatment in Example 44 are shown in FIGS. 2, 3 and 4.

Reflectivity of Substrate After Etching

The measurements of the reflectivity were made as follows. As to a monocrystalline silicon substrate, an optical reflectivity (2 fields) at a wavelength of from 300 to 1,200 nm was measured with a spectrophotometer (equipped with integrating sphere) SolidSpec 3700 manufactured by Shimadzu Corporation, and compared with an average of the optical reflectivity at a wavelength of 600 nm. As to a polycrystalline silicon substrate, an optical reflectivity (10 fields) at a wavelength of from 300 to 1,200 nm was measured with a spectrophotometer (equipped with integrating sphere) UH4150 manufactured by HITACHI LTD., and compared with an average of the optical reflectivity at a wavelength of 600 nm.

Amount of Etching

The amount of etching was obtained by determining a difference in the mass of the substrates before and after the etching reaction with a precision balance CP224S manufactured by SARTORIUS.

Here, the details of the hydroxystyrene polymers, derivatives of the polymers, and comparative components used above are listed in Table 3-1 and Table 3-2.

TABLE 3-1

| | Polyhydroxystyrene Component | (Weight-Average) Molecular Weight |
|---|---|---|
| a | 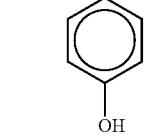 Polyhydroxystyrene (PHS) | Mw~2000 |
| b | 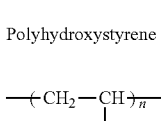 PHS | Mw~5000 |
| c | 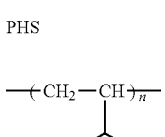 PHS | Mw~10000 |
| d | 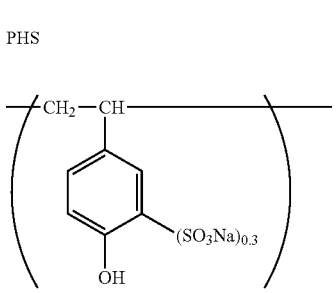 Sulfonated PHS | Mw~2400 |
| e | 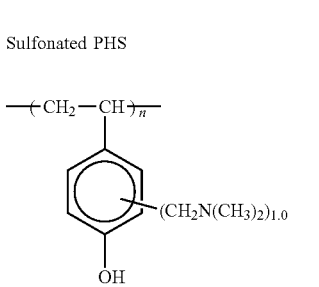 Aminomethylated PHS | Mw~2800 |

TABLE 3-2 f $$\left(\!\!\begin{array}{c}\text{CH}\!-\!\text{CH}_2\\|\\ \phantom{x}\\ \text{OH}\end{array}\!\!\right)_{\!\!n}\!\!\left(\!\!\begin{array}{c}\text{CH}\!-\!\text{CH}_2\\|\\ \phantom{x}\end{array}\!\!\right)_{\!\!m}$$ Mw~3820

Copolymer of PHS and Styrene g $$\left(\!\!\begin{array}{c}\text{CH}\!-\!\text{CH}_2\\|\\ \phantom{x}\\ \text{OH}\end{array}\!\!\right)\!\!\left(\!\!\begin{array}{c}\text{CH}_3\\|\\ \text{C}\!-\!\text{CH}_2\\|\\ \text{C}\!=\!\text{O}\\|\\ \text{O}\!-\!\text{CH}_3\end{array}\!\!\right)$$ Mw~9700

Copolymer of PHS and Methyl Methacrylate h  —(CH₂—CH)ₙ—  Mw~4700

Nitric Acid Neutralized Product of Aminoalkanol Compound of PHS (structure with phenol, CH₂-N⁺H(CH₃)-CH₂CH₂OH, ·NO₃⁻, subscript 1.0)

i  Phenol  Mw = 94.1 j  o-Cresol  Mw = 108.14

Here, the details of the ligninsulfonic acids (salts thereof) and comparative components used above are listed in Table 4.

TABLE 4

Kinds of Lignins and Ligninsulfonates

| | | Weight-Average Molecular Weight | Sulfonate Group Density (per 500 Units of Molecular Weight) | Number of Carboxyl groups (per 500 Units of Molecular Weight) |
|---|---|---|---|---|
| Type A | Sodium Ligninsulfonate | 20,000 | 1.2 | 0.5 or less |
| Type B | Sodium Ligninsulfonate | 15,000 | 1.1 | 0.5 or less |
| Type C | Sodium Ligninsulfonate | 5,000 | 1.3 | 1 or less |
| Type D | Sodium Ligninsulfonate | 3,600 | 0.8 | 1.5 or less |
| Type E | Sodium Ligninsulfonate | 700 | 0.3 | 1.5 or less |
| Type F | Sodium Ligninsulfonate | 120,000 | 1.0 | 0.5 or less |
| Type G | Lignin (CAS 9005-53-2) Manufacturer (Tokyo Chemical Industry Co., Ltd.) | — | — | — |

The weight-average molecular weight is a value obtained in accordance with the GPC method described in the specification.

By using the etching agent containing a hydroxystyrene polymer represented by the general formula (1), i.e., any one of a, b, c, d, e, f, g, and h in the tables, a semiconductor substrate for solar cells having pyramidal shapes having an average size of from 1 to 20 μm could be produced. In addition, according to the present invention, a semiconductor substrate for solar cells having a smaller reflectivity and having an smaller etching amount, and having excellent other surface properties of the substrate, for example, shininess, surface quality, and uniformity of pyramidal sizes could be produced.

It could be seen from Examples 4 to 6 that surface qualities (non-uniformity, streaks, comet-shaped defects) after the etching treatment could be further improved by blending an etching agent with a ligninsulfonate.

It could be seen from Examples 8 and 9, from Examples 16 and 17, and from Examples 24 and 25 that storage stability of the etching agent could be further improved by blending an etching agent with a chelating agent.

On the other hand, in Comparative Examples 1 to 9 where a hydroxystyrene polymer is not contained, the surface properties of the substrate were worsened. In Comparative Example 5, 6, or 8, an example where phenol or cresol was used in place of the hydroxystyrene polymer, the surface properties of the substrate were worsened even when the component were used, and there were some examples where the etching amount was very large (Comparative Examples 5 to 6).

It could be seen from Examples 45 to 56 that in a case where a polycrystalline silicon substrate was used, the reflectivity was smaller by the use of the etching agent of the present invention than a case where a conventional alkali etching agent was used (Comparative Example 10). In addition, it could be seen that the reflectivity was smaller than a case where a substrate was subjected to an etching treatment with a conventional mixed acid of hydrofluoric acid and nitric acid alone (Comparative Examples 11 and 12), so that a semiconductor substrate for solar cells having pyramidal shapes having average sizes of from 1 to 20 μm could be produced.

In Examples 46 and 47, the presence and absence of a chelating agent sodium ascorbate is compared. It could be seen that sodium ascorbate had an effect of diminishing pyramidal sizes, so that sodium ascorbate was effective in controlling pyramidal sizes.

It could be seen from Example 44 that the etching agent of the present invention had the property of maintaining the etching effects of the same level as a first batch even when continuously used up to a 10th batch. Also, it could be seen that the etching agent of the present invention could maintain the etching effects of the same level as a first batch at a point of a 35th batch by additionally supplementing the polyhydroxystyrene every 10 batches.

INDUSTRIAL APPLICABILITY

The etching agent of the present invention can be used as an etching agent when a surface of a semiconductor substrate for solar cells is subjected to an etching treatment.

The invention claimed is:

1. An alkaline etching agent for treating a surface of a semiconductor substrate for solar cells, comprising
at least one hydroxystyrene polymer represented by the following general formula (1):

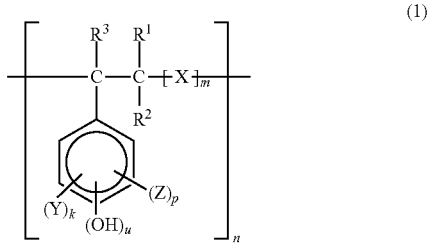

wherein each of m and n is m≥0 and n≥3, and is any number in which a weight-average molecular weight of the polymer represented by the general formula (1) satisfies a range of from 1,000 to 50,000; each of k, p, and u is 0≤k≤2, 0≤p 2, and 0<u≤2, wherein k, p, and u is an average in the polymer; each of $R^1$ to $R^3$ is H or an alkyl group having from 1 to 5 carbon atoms; X is a constituting unit of a polymerizable vinyl monomer; each of Y and Z, which is identical or different, is a substituent selected from the group consisting of

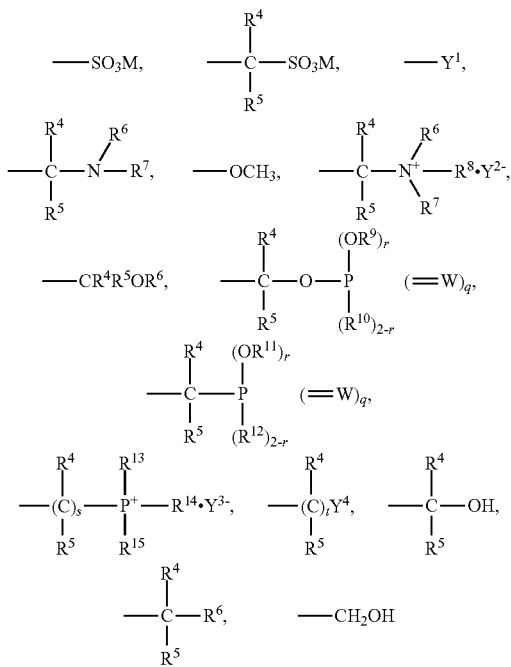

or an alkyl group having from 1 to 18 carbon atoms or an aryl group having from 6 to 18 carbon atoms, wherein M is H, an alkali metal, an alkaline earth metal, or an organic cation; each of $Y^1$ and $Y^4$ is a halogen; each of $Y^{2-}$ and $Y^{3-}$ is a counterion; W is S or O; each of $R^4$ to $R^8$, which is identical or different, is a linear or branched alkyl group, an alkyl derivative group, an aromatic group, or H, wherein $R^6$ and $R^7$ may further form a ring via an N group; each of $R^9$ to $R^{15}$, which is identical or different, is a linear or branched alkyl group, an alkyl derivative group, an aromatic group, or H; each of q, s, and t is 0 or 1; and r is 0, 1, or 2, and an alkaline agent; and further comprising at least one component selected from the group consisting of ligninsulfonic acids and ligninsulfonates, wherein the ligninsulfonic acids and ligninsulfonates satisfy following conditions 1) to 3):

1) having a molecular weight distribution peak falling between 1,000 and 100,000, and at least 50% by mass of the components exist within this molecular weight range, 2) having a sulfonate group density in average of 0.6 or more and less than 3 per 500 units of the molecular weight, and 3) having zero to three carboxyl groups per 500 units of the molecular weight.

2. The etching agent according to claim 1, further comprising at least one component selected from the group consisting of chelating agents, silicic acid and silicates.

3. The etching agent according to claim 1, wherein the surface shape of a semiconductor substrate for solar cells after etching with the etching agent has pyramidal ruggedness.

4. An etching ability restoring agent which is added to an etching agent as defined in claim 1 after treatment of a semiconductor substrate for solar cells with the etching agent, to restore etching ability of the etching agent, wherein the etching ability restoring agent comprises an alkaline agent, and at least one member of a hydroxystyrene polymer represented by the following general formula (1):

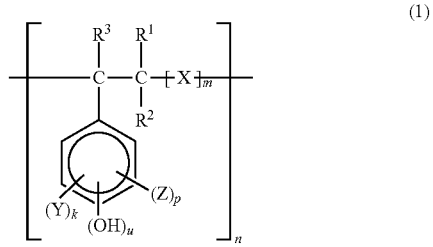

wherein each of m and n is m≥0 and n≥3, and is any number in which a weight-average molecular weight of the polymer represented by the general formula (1) satisfies a range of from 1,000 to 50,000; each of k, p, and u is 0≤k≤2, 0≤p≤2, and 0<u≤2, wherein k, p, and u is an average in the polymer; each of $R^1$ to $R^3$ is H or an alkyl group having from 1 to 5 carbon atoms; X is a constituting unit of a polymerizable vinyl monomer; each of Y and Z, which is identical or different, is a substituent selected from the group consisting of

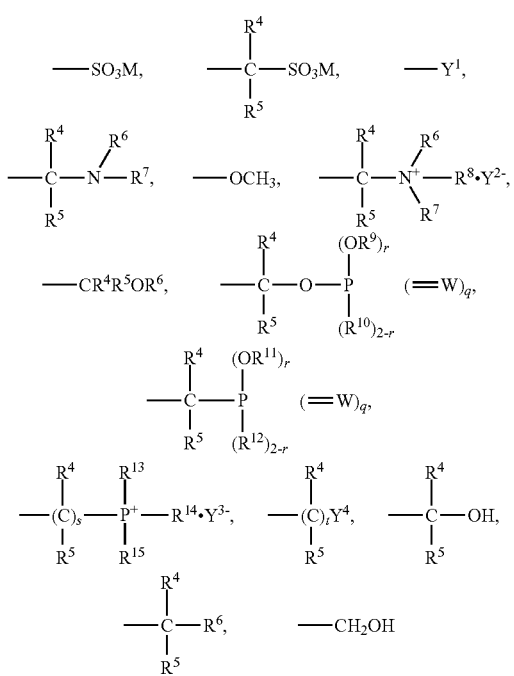

or an alkyl group having from 1 to 18 carbon atoms or an aryl group having from 6 to 18 carbon atoms, wherein M is H, an alkali metal, an alkaline earth metal, or an organic cation; each of $Y^1$ and $Y^4$ is a halogen; each of $Y^{2-}$ and $Y^{3-}$ is a counterion; W is S or O; each of $R^4$ to $R^8$, which is identical or different, is a linear or branched alkyl group, an alkyl derivative group, an aromatic group, or H, wherein $R^6$ and $R^7$ may further form a ring via an N group; each of $R^9$ to $R^{15}$, which is identical or different, is a linear or branched alkyl group, an alkyl derivative group, an aromatic group, or H; each of q, s, and t is 0 or 1; and r is 0, 1, or 2.

5. A method for producing a semiconductor substrate for solar cells, comprising an etching step of etching a substrate surface of a semiconductor substrate for solar cells with an etching agent as defined in claim 1 to form ruggedness on the substrate surface.

6. The method according to claim 5, wherein the projection parts of the ruggedness formed on the substrate surface have pyramidal shapes.

7. The method according to claim 6, wherein an average size of the pyramidal shapes is from 0.5 to 30 μm.

8. The method according to claim 5, wherein the optical reflectivity of the semiconductor substrate for solar cells after etching at a wavelength of 600 nm is 10% or less.

9. A semiconductor substrate for solar cells, wherein a surface thereof is subjected to an etching treatment with an etching agent as defined in claim 1.

10. The semiconductor substrate for solar cells according to claim 9, wherein the ruggedness is formed on the substrate surface.

11. The semiconductor substrate for solar cells according to claim 10, wherein the projection parts of the ruggedness formed on the substrate surface have pyramidal shapes.

12. The semiconductor substrate for solar cells according to claim 11, wherein an average size of the pyramidal shapes is from 0.5 to 30 μm.

13. The semiconductor substrate for solar cells according to claim 9, wherein the optical reflectivity at a wavelength of 600 nm is 10% or less.

14. Solar cell comprising a semiconductor substrate for solar cells as defined in claim 9.

* * * * *